(12) United States Patent
Lai et al.

(10) Patent No.: US 12,014,969 B2
(45) Date of Patent: Jun. 18, 2024

(54) PACKAGE STRUCTURE AND METHOD FOR FORMING THE SAME

(71) Applicant: Taiwan Semiconductor Manufacturing Company, Ltd., Hsinchu (TW)

(72) Inventors: Po-Chen Lai, Hsinchu County (TW); Ming-Chih Yew, Hsinchu (TW); Li-Ling Liao, Hsinchu (TW); Chin-Hua Wang, New Taipei (TW); Po-Yao Lin, Zhudong Township, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 246 days.

(21) Appl. No.: 17/460,836

(22) Filed: Aug. 30, 2021

(65) Prior Publication Data

US 2023/0066598 A1 Mar. 2, 2023

(51) Int. Cl.
*H01L 23/48* (2006.01)
*H01L 21/56* (2006.01)
*H01L 23/00* (2006.01)
*H01L 23/31* (2006.01)
(Continued)

(52) U.S. Cl.
CPC .......... *H01L 23/3178* (2013.01); *H01L 21/56* (2013.01); *H01L 23/49822* (2013.01); *H01L 23/49833* (2013.01); *H01L 23/49838* (2013.01); *H01L 24/73* (2013.01); *H01L 25/0655* (2013.01); *H01L 2224/73204* (2013.01); *H01L 2924/1434* (2013.01); *H01L 2924/1811* (2013.01); *H01L 2924/1815* (2013.01); *H01L 2924/182* (2013.01)

(58) Field of Classification Search
CPC ........................... H01L 23/3178; H01L 21/56
See application file for complete search history.

(56) References Cited

U.S. PATENT DOCUMENTS

| 9,000,584 B2 | 4/2015 | Lin et al. |
| 9,048,222 B2 | 6/2015 | Hung et al. |
| 9,048,233 B2 | 6/2015 | Wu et al. |

(Continued)

FOREIGN PATENT DOCUMENTS

| TW | 201001640 A | 1/2010 |
| TW | 201114008 A | 4/2011 |

(Continued)

OTHER PUBLICATIONS

Chinese language office action dated Dec. 12, 2022, issued in application No. TW 111118022.

*Primary Examiner* — Nicholas J Tobergte
(74) *Attorney, Agent, or Firm* — McClure, Qualey & Rodack, LLP

(57) ABSTRACT

A package structure is provided. The package structure includes a redistribution structure over a substrate, a semiconductor die over the redistribution structure and electrically coupled to the substrate, and an underfill material over the substrate and encapsulating the redistribution structure and the semiconductor die. The underfill material includes an extension portion overlapping a corner of the semiconductor die and extending into the substrate.

20 Claims, 25 Drawing Sheets

(51) Int. Cl.
*H01L 23/498* (2006.01)
*H01L 25/065* (2023.01)

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,728,479 B2* | 8/2017 | Chou ............... H01L 23/3157 |
| 11,264,354 B2* | 3/2022 | Park ................... H01L 24/14 |
| 11,443,993 B2 | 9/2022 | Jeng et al. |
| 2011/0198760 A1* | 8/2011 | Shibuya ........... H01L 23/49838 29/829 |
| 2012/0299193 A1 | 11/2012 | Shibuya |
| 2012/0313240 A1 | 12/2012 | Cheng et al. |
| 2019/0206822 A1 | 7/2019 | Park et al. |
| 2020/0258801 A1 | 8/2020 | Lin et al. |

FOREIGN PATENT DOCUMENTS

| | | |
|---|---|---|
| TW | 201230274 A | 7/2012 |
| TW | 201250943 A | 12/2012 |
| TW | 202111882 A | 3/2021 |

\* cited by examiner

PACKAGE STRUCTURE AND METHOD FOR FORMING THE SAME

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize a smaller area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1A-1 is a plan view of the package structure shown in FIG. 1A, in accordance with some embodiments of the disclosure.

FIG. 1B-1 is a plan view of the package structure shown in FIG. 1B, in accordance with some embodiments of the disclosure.

FIG. 1E-1 is a plan view of the package structure shown in FIG. 1E, in accordance with some embodiments of the disclosure.

FIG. 1F-1 is a plan view of the package structure shown in FIG. 1F, in accordance with some embodiments of the disclosure.

FIG. 1F-2 is an enlarged plan view of area R shown in FIG. 1F-1 to illustrate details of a package structure, in accordance with some embodiments of the disclosure.

FIG. 1G-1 is an enlarged plan view of FIG. 1G corresponding to area R shown in FIG. 1F-1 to illustrate details of a package structure, in accordance with some embodiments of the disclosure.

FIG. 2 is a modification of FIG. 1G-1, in accordance with some embodiments of the disclosure.

FIG. 6-1 is a plan view of a modification of the package structure of FIG. 1G, in accordance with some embodiments of the disclosure.

FIG. 6-2 is an enlarged plan view of area R shown in FIG. 6-1, in accordance with some embodiments of the disclosure.

FIG. 7-1 is a plan view of a modification of the package structure of FIG. 1G, in accordance with some embodiments of the disclosure.

FIG. 7-2 is an enlarged plan view of area R shown in FIG. 7-1, in accordance with some embodiments of the disclosure.

FIG. 8-1 is a plan view of the package structure shown in FIG. 8, in accordance with some embodiments of the disclosure.

FIG. 8-2 is an enlarged plan view of area R shown in FIG. 8-1 to illustrate details of a package structure, in accordance with some embodiments of the disclosure.

DETAILED DESCRIPTION

Figure 1A:
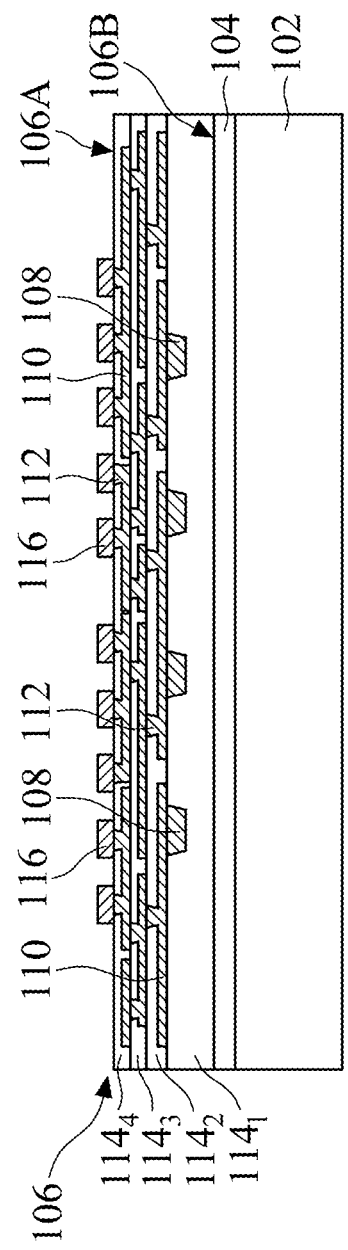
FIGS. 1A through 1G are cross-sectional views illustrating the formation of a package structure at various intermediate stages, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective may substantially be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of a package structure are provided. The package structure may include a redistribution structure over a substrate and a semiconductor die over the redistribution structure and electrically coupled to the substrate. The substrate may include a trench overlapping a corner of the semiconductor die and filled with an underfill material. As a result, the tensile stress concentrated at the corner of the semiconductor die may be reduced or mitigated. Therefore, the risk of cracking of an underfill material may be reduced, improving the performance and reliability of the package structure.

FIGS. 1A through 1G are cross-sectional views illustrating the formation of a package structure at various intermediate stages, in accordance with some embodiments of the disclosure.

A carrier substrate 102 is received or provided, as shown in FIG. 1A, in accordance with some embodiments. In some embodiments, the carrier substrate 102 is a ceramic substrate, a glass substrate, a polymer substrate, a semiconductor substrate, or another suitable substrate.

An adhesive tape 104 is disposed over the carrier substrate 102, as shown in FIG. 1A, in accordance with some embodiments. In some embodiments, the adhesive tape 104 is sensitive to an energy beam irradiation. In some embodiments, the adhesive tape 104 is a release layer that is made of or includes a light-to-heat conversion (LTHC) material. For example, a laser beam may be used to irradiate the adhesive tape 104 in a subsequent process. The irradiation may allow a package structure formed over the adhesive tape 104 to be separated from the carrier substrate 102.

A redistribution structure 106 is formed over the adhesive tape 104, as shown in FIG. 1A, in accordance with some embodiments. The redistribution structure 106 is configured for routing, which enables the formation of a package structure with fan-out features. The redistribution structure 106 may also be referred to as an interposer. The redistribution structure 106 has a bottom surface 106B that faces the carrier substrate 102 and a top surface 106A that faces away from the carrier substrate 102, in accordance with some embodiments.

In some embodiments, the redistribution structure 106 includes multiple insulating layers such as insulating layers $114_1$, $114_2$, $114_3$ and $114_4$ and multiple conductive features such as conductive features 108, 110 and 112 formed in the insulating layers. Although FIG. 1A shows four insulating layers $114_1$-$114_4$, the number of the insulating layers is not limited thereto and the redistribution structure 106 may include less or more the insulating layers.

In some embodiment, the conductive features 108 are surrounded by and/or embedded in the insulating layers $114_1$. In some embodiment, the conductive features 108 are conductive vias. In some embodiments, the conductive features 108 are configured to provide vertical electrical routing. In some embodiments, the conductive features 108 are to be exposed from or protrude from the bottom surface 106B of the redistribution structure 106 and used to hold or receive under bump metallurgy (UBM) structures and bonding elements.

In some embodiments, the conductive features 110 are surrounded by and/or embedded in the insulating layers $114_2$-$114_4$. In some embodiments, the conductive features 110 include conductive pads, conductive lines and/or conductive traces and are configured to provide horizontal electrical routing. In some embodiments, the conductive features 108 are in contact with the conductive features 110 (e.g., conductive pads) in the insulating layer $114_2$.

In some embodiments, the conductive features 112 are surrounded by and/or embedded in the insulating layers $114_2$-$114_4$. In some embodiments, the conductive features 112 are conductive vias and configured to provide vertical electrical routing. In some embodiments, the conductive features 112 land on the conductive pads of the conductive features 110, thereby electrically coupling the conductive features 110 in different insulating layers 114. In some embodiments, the conductive features 112 in the insulating layer $114_4$ are exposed from and/or protruding from the top surface 106A of the insulating layer $114_4$ of the redistribution structure 106 and are used to hold or receive under bump metallurgy structures and bonding elements.

In some embodiments, the insulating layers 114 may be made of one or more polymer materials. The polymer material(s) may include polybenzoxazole (PBO), benzocyclobutene (BCB), polyimide (PI), epoxy-based resin, one or more other suitable polymer materials, or a combination thereof. In some embodiments, the polymer material is photosensitive. A photolithography process may therefore be used to form openings with desired patterns in the insulating layers $114_1$-$114_4$. In alternative embodiments, the insulating layers 114 are made of one or more dielectric materials such as silicon oxide, silicon nitride and/or silicon oxynitride.

In some embodiments, the conductive features 108, 110 and 112 are made of metallic material such as copper, aluminum, gold, palladium, cobalt, titanium, nickel, silver, graphene, one or more other suitable conductive materials, an alloy thereof, or a combination thereof. In some embodiments, the conductive features 108, 110 and 112 are made of non-solder metallic material. In some embodiments, the conductive features 108, 110 and 112 include multiple sub-layers. For example, each of the conductive features 108, 110 and 112 contains multiple sub-layers including Ti/Cu, Ti/Ni/Cu, Ti/Cu/Ti, Al/Ti/Ni/Ag, other suitable sublayers, or a combination thereof.

The formation of the redistribution structure 106 may involve multiple deposition processes, multiple patterning processes, and/or multiple planarization processes. The deposition processes may be used to form insulating layers and/or conductive layers. The deposition processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, a dry polishing process, one or more other applicable processes, or a combination thereof.

Figures 1, 1A:
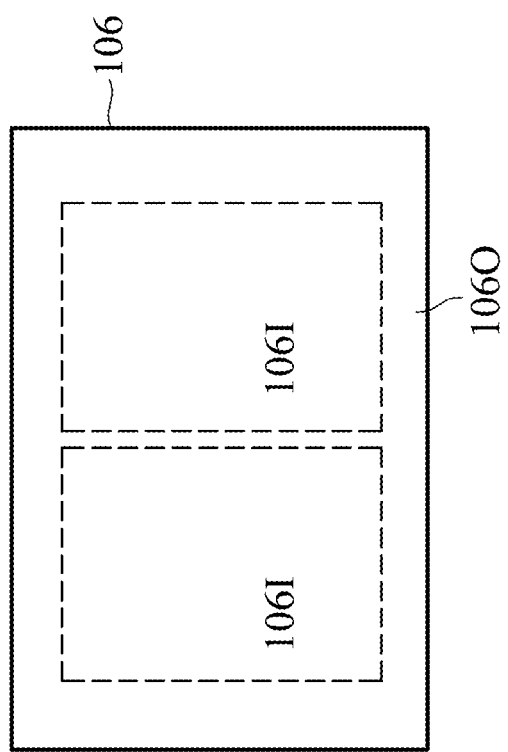

FIG. 1A-1 is a plan view of the package structure shown in FIG. 1A, in accordance with some embodiments of the disclosure. FIG. 1A-1 illustrates the redistribution structure 106 which may include fan-in regions 1061 in which semiconductor dies are to be disposed correspondingly and a fan-out region 1060 adjoining the fan-in regions 1061. The fan-out region 1060 continuously surrounds the fan-in regions 1061, in accordance with some embodiments.

Referring back to FIG. 1A, under bump metallurgy structures 116 are formed over the top surface 106A of the redistribution structure 106, in accordance with some embodiments. In some embodiments, the under bump metallurgy structures 116 correspond and in contact with the conductive vias 112 exposed from the insulating layer 114₄.

In some embodiments, the under bump metallurgy structures 116 are used to hold or receive bonding elements such as solder balls. UBM material may be used to increase adherence of solder (such as by providing solderability and wettability for solder), provide a solder diffusion barrier, provide some stress relief in the connection between the solder and the conductive vias 112, and provide low resistance in the contact to the conductive vias 112.

In some embodiments, the under bump metallurgy structures 116 are made of or include metallic material such as titanium, copper, nickel, tantalum, vanadium, chromium, gold, tungsten, an alloy thereof, a multi-layer thereof, or a combination thereof. In some embodiments, the under bump metallurgy structures 116 are made of non-solder metallic material. In some embodiments, the under bump metallurgy structures 116 are formed using sputtering, evaporation, plating, another suitable technique, and/or a combination thereof.

Figure 1B:
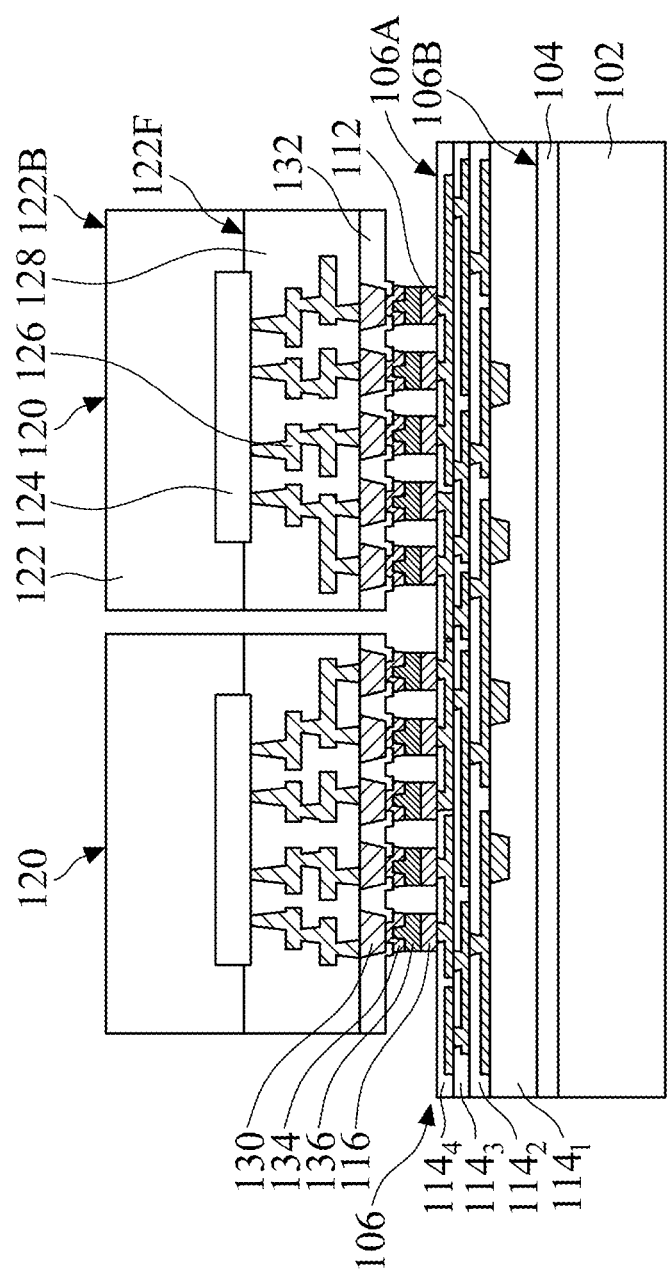
Figures 1, 1B:
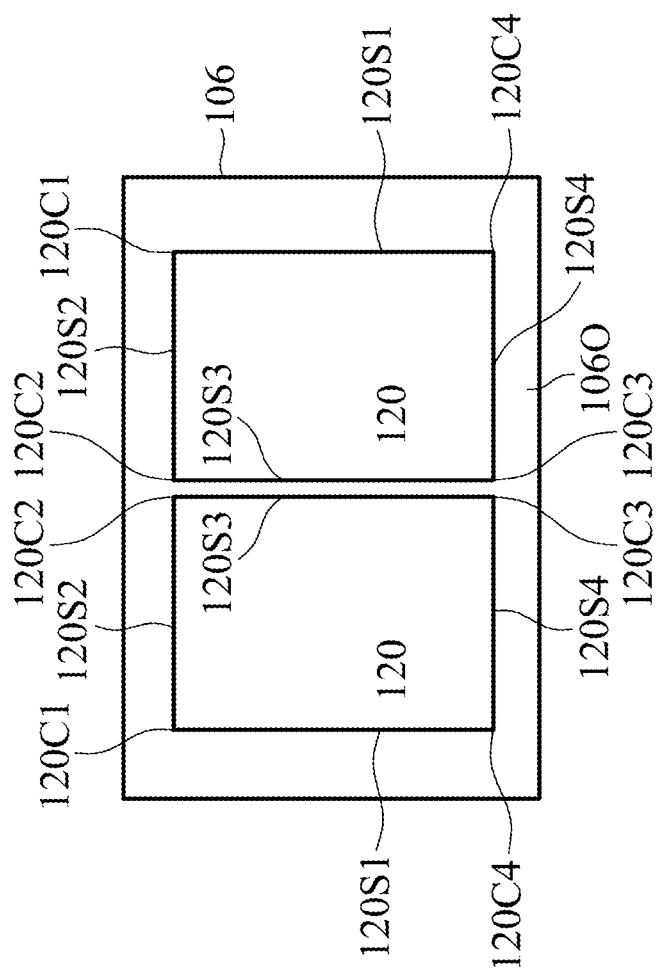

Semiconductor dies 120 are disposed over the top surface 106A of the redistribution structure 106, as shown in FIG. 1B, in accordance with some embodiments. The semiconductor dies 120 are disposed within the fan-in regions 1061 of the redistribution structure 106, in accordance with some embodiments.

The semiconductor die 120 may include application processors, power management integrated circuits, logic devices, memory devices (e.g., static random access memories, SRAMs), radio frequency (RF) devices, input/output (I/O) devices, system-on-chip (SoC) devices, application-specific integrated circuit (ASIC), one or more other suitable circuits, or a combination thereof.

In some embodiments, the semiconductor die 120 includes a semiconductor substrate 122 having a backside surface 122B and a front surface 122F. In some embodiments, the semiconductor die 120 also includes an integrated circuit 124 formed in and/or on the front surface 122F of the semiconductor substrate 122. In some embodiments, the semiconductor die 120 also includes an interconnect structure 126 surrounded by an intermetal (IMD) dielectric layer 128 and electrically coupled to the integrated circuit 124. In some embodiments, the semiconductor die 120 also includes conductive pads 130 formed over and electrically coupled to the interconnect structure 126. In some embodiments, the semiconductor die 120 also includes a passivation layer 132 partially covering the conductive pads 130 and having openings partially exposing the conductive pads 130.

Under bump metallurgy structures 134 are formed over the conductive pads 130 of the semiconductor die 120, in accordance with some embodiments. The under bump metallurgy structures 134 pass through the passivation layer 132 and cover the exposed surface of the conductive pads 130.

In some embodiments, the under bump metallurgy structures 134 are used to hold or receive bonding elements 136. In some embodiments, the under bump metallurgy structures 134 are made of or include metallic material such as titanium, copper, nickel, tantalum, vanadium, chromium, gold, tungsten, an alloy thereof, a multi-layer thereof, or a combination thereof. In some embodiments, the under bump metallurgy structures 134 are made of non-solder metallic material. In some embodiments, the under bump metallurgy structures 134 are formed using sputtering, evaporation, plating, another suitable technique, and/or a combination thereof.

In some embodiments, an electroplating process is performed to form the bonding elements 136 over the under bump metallurgy structures 134. In alternative embodiments, the bonding elements 136 are pre-formed and placed over the under bump metallurgy structures 116.

In some embodiments, the bonding elements 136 are solder joints, microbumps, solder bumps, solder balls, ball grid array (BGA) balls, controlled collapse chip connection (C4) bumps, another suitable bonding elements, and/or a combination thereof. In some embodiments, the bonding elements 136 are tin-containing solder balls bumps or solder balls. The tin-containing solder bumps or balls may include copper, silver, gold, aluminum, lead, one or more other suitable materials, or a combination thereof. In some embodiments, the bonding elements 136 are lead-free.

The conductive pads 130 of the semiconductor die 120 are bonded to conductive vias 112 of the redistribution structure 106 through the under bump metallurgy structures 134, the bonding elements 136 and the under bump metallurgy structures 116, in accordance with some embodiments. In some embodiments, a thermal reflow operation is carried out. In some embodiments, the bonding elements 136 correspond to and connect the under bump metallurgy structures 134 and the under bump metallurgy structures 116. As such, the integrated circuit 124 is electrically coupled to the conductive features 108, 110 and 112 of the redistribution structure 106, in accordance with some embodiments.

FIG. 1B-1 is a plan view of the package structure shown in FIG. 1B, in accordance with some embodiments of the disclosure. In some embodiments, the semiconductor dies 120 are arranged side by side.

In some embodiments, the semiconductor dies 120 have a rectangular- or square-shaped profile, in FIG. 1B-1. In some embodiments, the edge (or the periphery) of the semiconductor die 120 is aligned with the boundary between the fan-in region 1061 and the fan-out region 1060 of the redistribution structure 106. In some embodiments, the edge of each of the semiconductor dies 120 includes four sidewalls 120S1, 120S2, 120S3 and 120S4. The sidewalls 120S1 and 120S2 intersect at a corner 120C1; the sidewalls 120S2 and 120S3 intersect at a corner 120C2; the sidewalls 120S3 and 120S4 intersect at a corner 120C3; and the sidewalls 120S4 and 120S1 intersect at a corner 120C4.

In some embodiments, the sidewall 120S3 and the corners 120C2 and 120C3 of one semiconductor die 120 are disposed immediately adjacent to the sidewall 120S2, the corners 120C2 and 120C3 of the other semiconductor die 120. In some embodiments, the corners 120C1 and 120C4 of the semiconductor dies 120 are not disposed adjacent to any other semiconductor die. Therefore, the corners 120C2 and 120C3 are referred to as closed corners and the corners 120C1 and 120C4 are referred to as open corners.

Figure 1C:
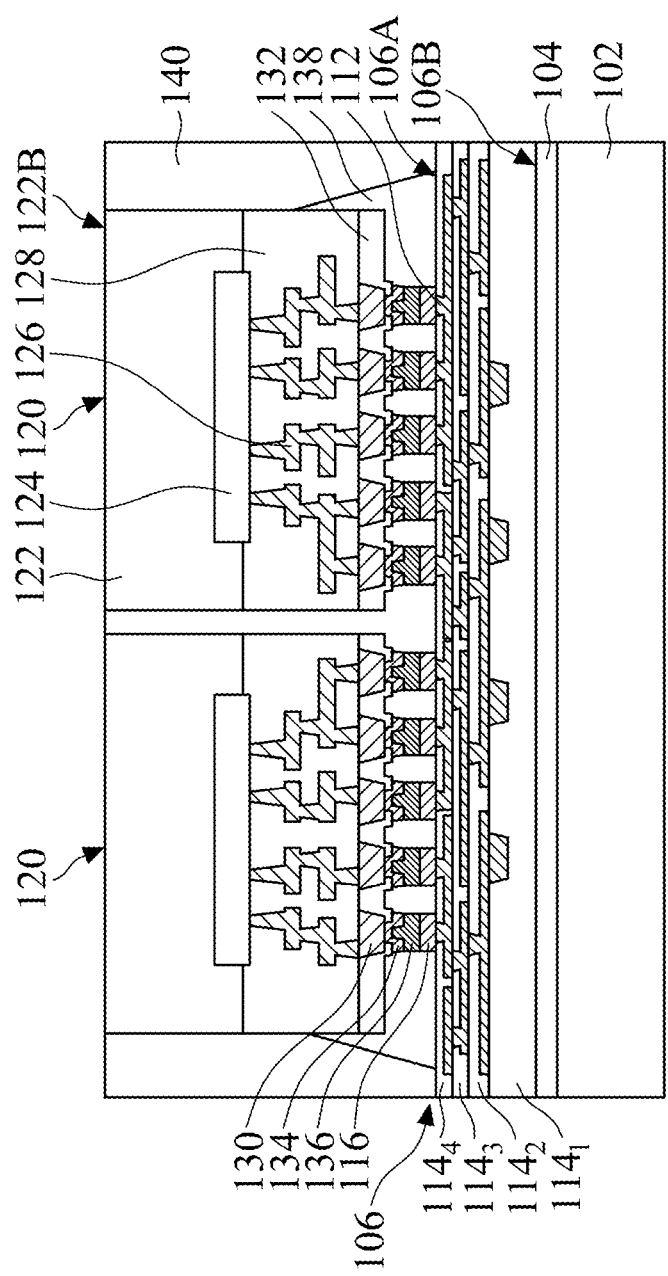

An underfill material 138 is formed over the top surface 106A of the redistribution structure 106, thereby encapsulating and/or surrounding the semiconductor die 120, the bonding elements 136, and the under bump metallurgy structures 116 and 134, as shown in FIG. 1C, in accordance with some embodiments. The underfill material 138 fills the spacing between the bonding elements 136, in accordance with some embodiments.

In some embodiments, the underfill material 138 is an electrically insulated adhesive for protecting the bonding elements 136 and the under bump metallurgy structures 116 and 134 and/or securing the semiconductor die 120. In some embodiments, the underfill material 138 is made of epoxy, resin, epoxy molding compounds, another suitable underfill material, and/or a combination thereof.

A molding compound 140 is formed over the top surface 106A of the redistribution structure 106, thereby encapsulating and/or surrounding the underfill material 138 and the semiconductor die 120, as shown in FIG. 1C, in accordance with some embodiments. In some embodiments, the molding compound 140 is a single-layer film or a composite stack. In some embodiments, molding compound 140 includes various materials, such as molding underfill, epoxy, resin, or the like. In some embodiments, the molding compound 140 has high thermal conductivity, low moisture absorption rate and high flexural strength.

The molding compound 140 are then planarized until the backside surface 122B of the semiconductor substrate 122 is exposed, in accordance with some embodiments. The planarization processes may include a mechanical grinding process, a chemical mechanical polishing (CMP) process, a dry polishing process, one or more other applicable processes, or a combination thereof.

Figure 1D:
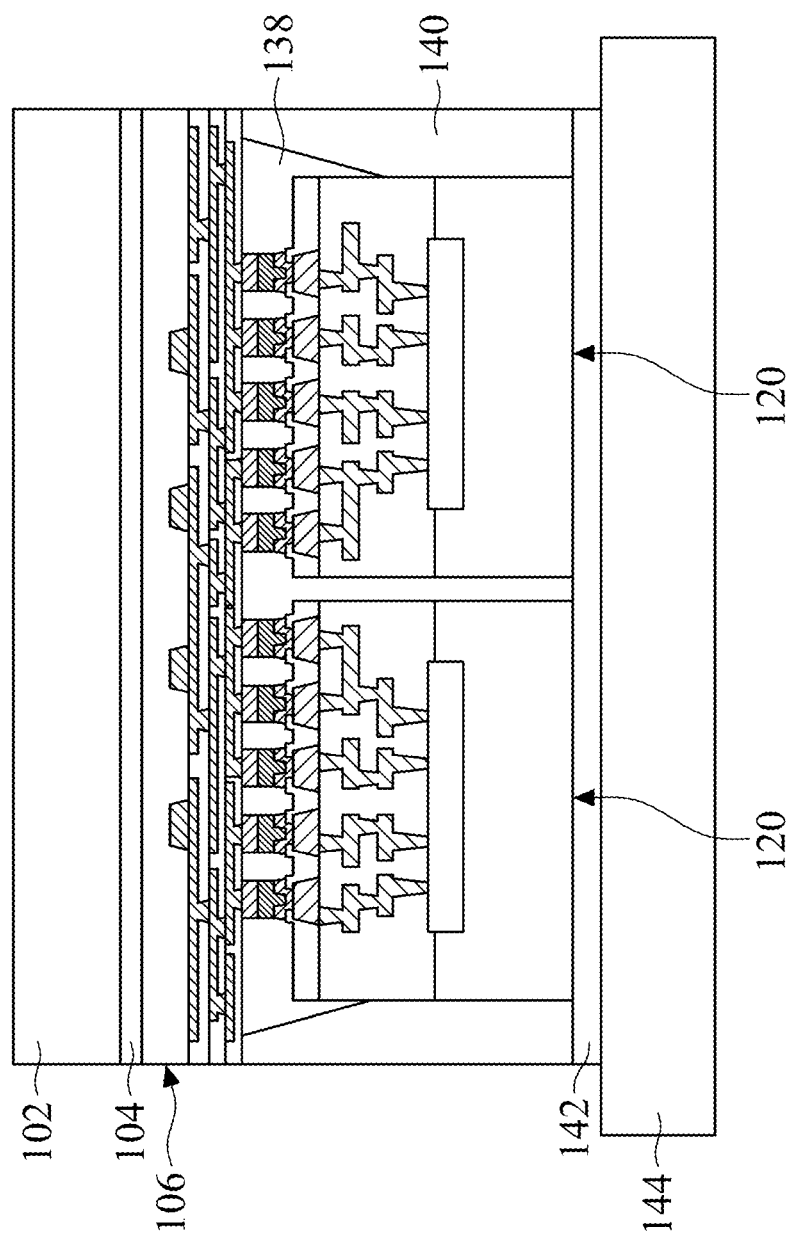

The upper surface (e.g., the backside surface 122B of the semiconductor substrate 122) of the structure of FIG. 1C is attached to a carrier substrate 144 and then flipped upside down, as shown in FIG. 1D, in accordance with some embodiments. The carrier substrate 144 is attached to the semiconductor substrate 122 and the molding compound 140 through an adhesive tape 142, thereby covering the semiconductor substrate 122 and the molding compound 140, in accordance with some embodiments. The carrier substrate 144 is configured to protect the semiconductor substrate 122 from being damaged during following processes, in accordance with some embodiments.

In some embodiments, the carrier substrate 144 is a ceramic substrate, a glass substrate, a polymer substrate, a semiconductor substrate, or another suitable substrate. In some embodiments, the adhesive tape 142 is a release layer that is made of or includes a light-to-heat conversion (LTHC) material. In some embodiments, the adhesive tape 142 is made of a different material than the adhesive tape 104.

Figure 1E:
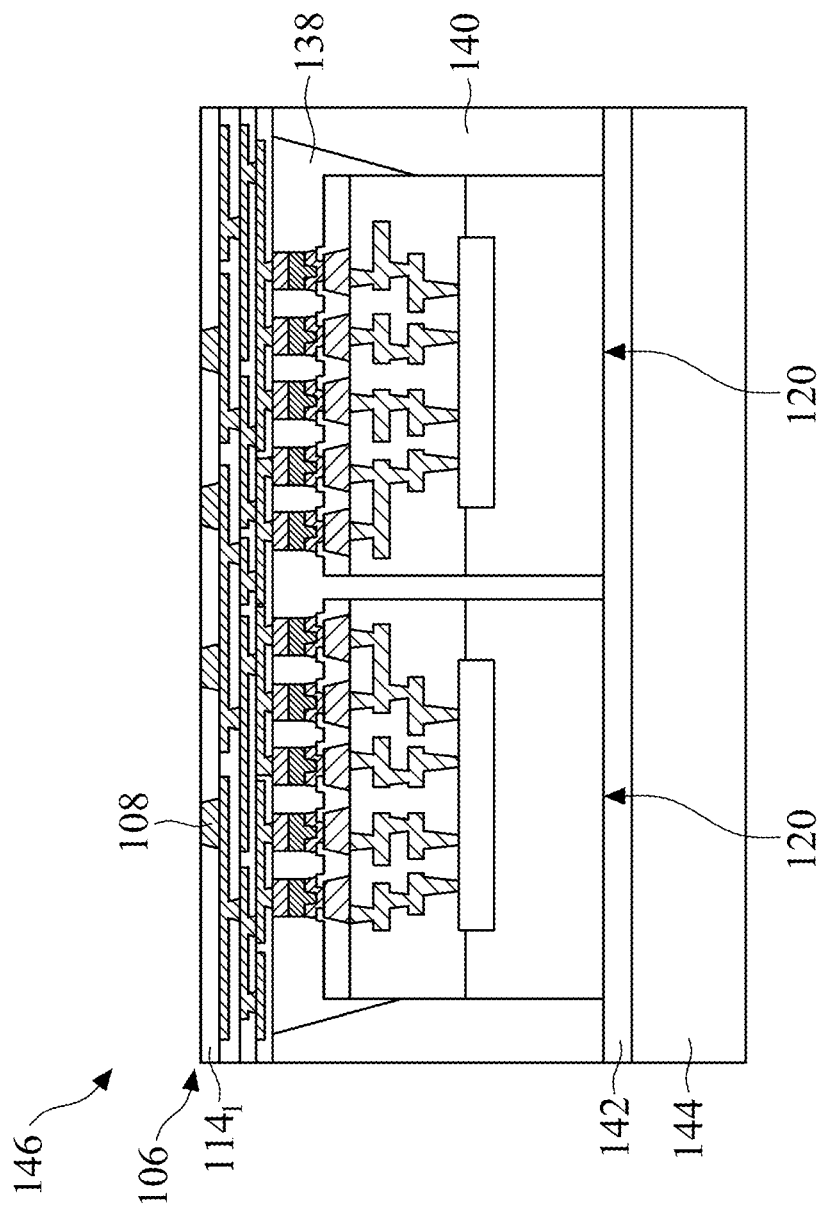
Figures 1, 1E:
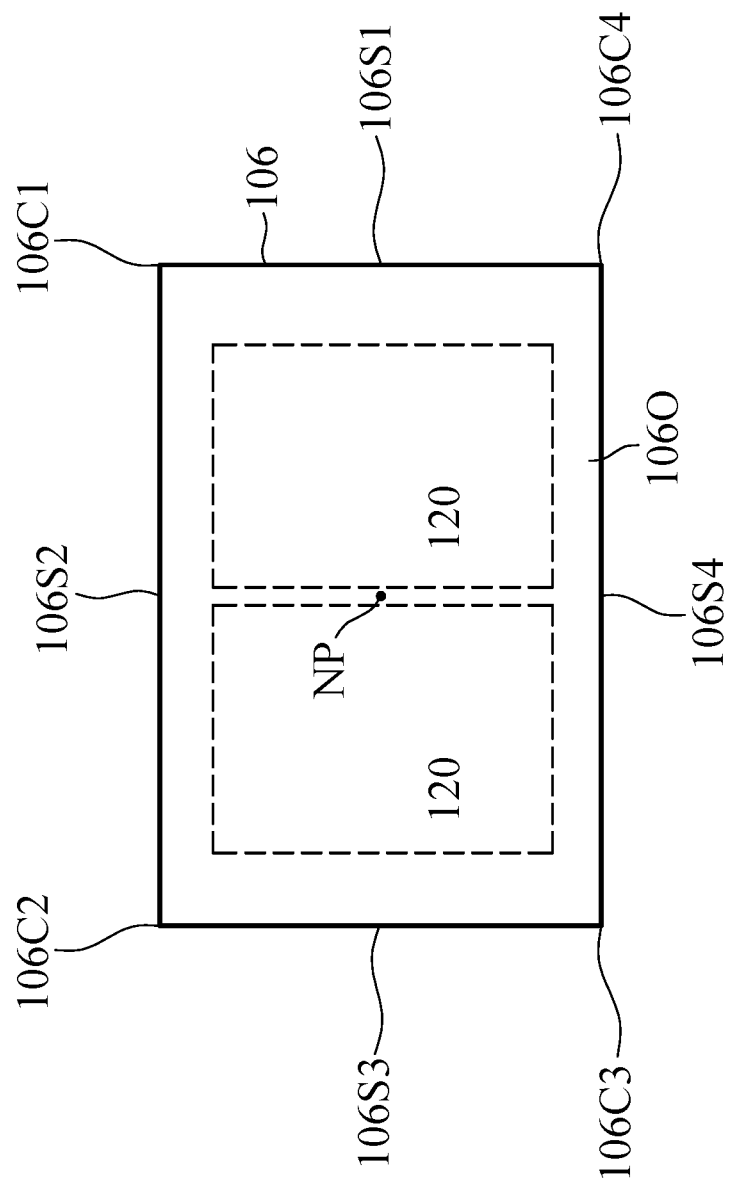

The carrier layer 102 is then taken away from the redistribution structure 106 by separating the adhesive tape 104 from the carrier layer 102 and the redistribution structure 106, as shown in FIG. 1E, in accordance with some embodiments. For example, a release process may be performed by irradiating the structure with an energy beam such as laser beam, an ultraviolet light, or another suitable energy beam. After the irradiation, the adhesive characteristics of the adhesive tape 104 may be destroyed or reduced. In some embodiments, the adhesive tape 142 may maintain adhesive even if being irradiated with the energy beam. After the release process, the insulating layer $114_1$ of the redistribution structure 106 is exposed, in accordance with some embodiments.

A planarization process is performed on the insulating layer $114_1$ of the redistribution structure 106 until the conductive features 108 are exposed from the insulating layer $114_1$, as shown in FIG. 1E, in accordance with some embodiments. The planarization processes may include a mechanical grinding process, a chemical mechanical polishing (CMP) process, a dry polishing process, one or more other applicable processes, or a combination thereof.

A sawing operation is performed to cut through the structure into multiple package structures 146 that are separated from one another, as shown in FIG. 1E, in accordance with some embodiments. FIG. 1E shows the cross-sectional view of one of the obtained package structures 146.

FIG. 1E-1 is a plan view of the package structure shown in FIG. 1E, in accordance with some embodiments of the disclosure. In some embodiments, the redistribution structure 106 has a rectangular- or square-shaped profile. In some embodiments, the edge (or periphery) of the redistribution structure 106 includes four sidewalls 106S1, 106S2, 106S3 and 106S4. The sidewalls 106S1 and 106S2 intersect at a corner 106C1; the sidewalls 106S2 and 106S3 intersect at a corner 106C2; the sidewalls 106S3 and 106S4 intersect at a corner 106C3; and the sidewalls 106S4 and 106S1 intersect at a corner 106C4.

FIG. 1E-1 also illustrates a neutral point NP of the redistribution structure 106. The neutral point of the redistribution structure 106 refers to the centermost point of the redistribution structure 106, in accordance with some embodiments. In some embodiments, in the plan view, the neutral point NP of the redistribution structure 106 is the geometric center of the profile of the redistribution structure 106, e.g., the intersection point of diagonals.

The carrier substrate 144 is then taken away from the package structure 146 by separating the adhesive tape 142 from the carrier substrate 144 and the semiconductor dies 120 (and the molding compound 140), in accordance with some embodiments. For example, a release process may be performed by irradiating the structure with an energy beam such as laser beam, an ultraviolet light, or another suitable energy beam. After the irradiation, the adhesive characteristics of the adhesive tape 142 may be destroyed or reduced.

Figure 1F:
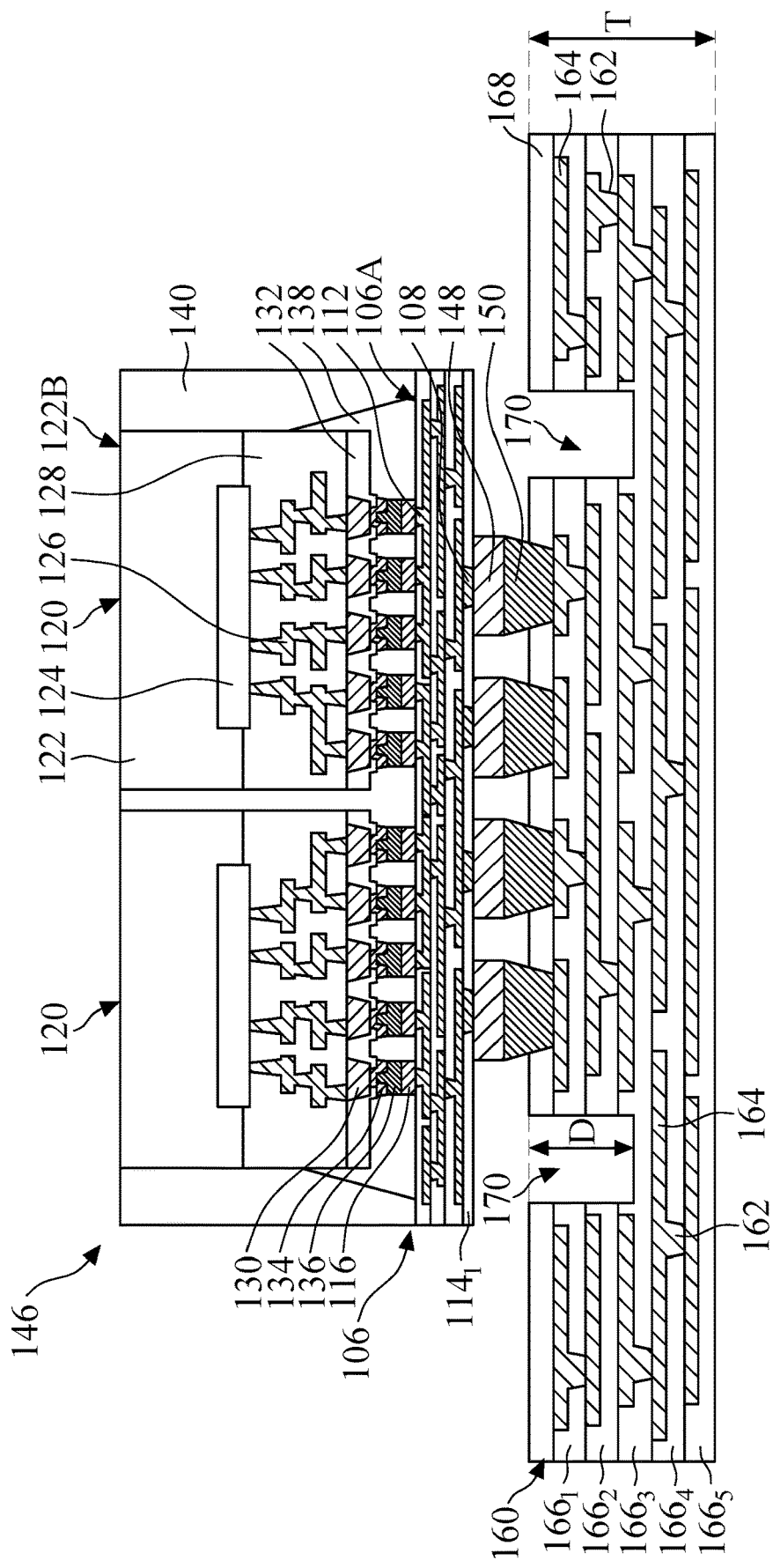
Figures 1, 1F:
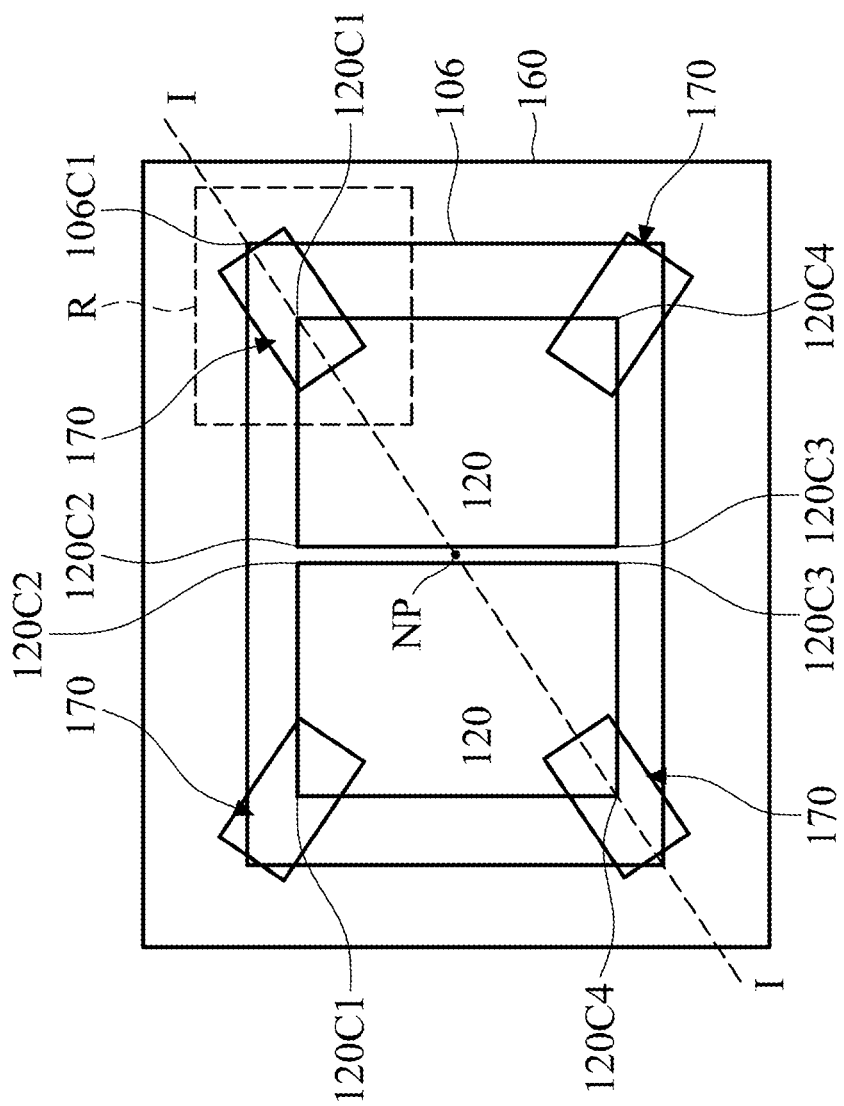

The package structure 146 is disposed over and bonded to a substrate 160 through bonding elements 150, as shown in FIG. 1F, in accordance with some embodiments. In some embodiments, the substrate 160 is a printed circuit board (PCB). In alternative embodiments, the substrate 160 is an interposer substrate that may then be bonded to another substrate. In some embodiments, the substrate 160 is fabricated with a predetermined functional circuit thereon. In some embodiments, the substrate 160 has a thickness T in a range from about 1 mm to about 2.5 mm.

In some embodiments, the substrate 160 includes multiple insulating layers such as insulating layers $166_1$, $166_2$, $166_3$, $166_4$ and $166_5$ and multiple conductive features such as conductive features 162 and 164 formed in the insulating layers. Although FIG. 1F shows five insulating layers $166_1$-$166_5$, the number of the insulating layers is not limited thereto and the substrate 160 may include less or more the insulating layers. In addition, the substrate 160 may include active circuitry components such as transistor, diode, and the like.

In some embodiments, the conductive features 162 are surrounded by and/or embedded in the insulating layers $166_1$-$166_4$. In some embodiments, the conductive features 162 are conductive vias and configured to provide vertical electrical routing. In some embodiments, the conductive features 164 are surrounded by and/or embedded in the insulating layers $166_1$-$166_5$. In some embodiments, the conductive features 164 include conductive pads, conductive lines and/or conductive traces and are configured to provide horizontal electrical routing. In some embodiments, the conductive features 162 land on the conductive pads of the conductive features 164, thereby electrically coupling the conductive features 164 in different insulating layers 166.

In some embodiments, the insulating layers 166 and the underfill material 180 are made of different insulating materials. In some embodiments, the insulating layers 166 may be made of ajinomoto build-up film (ABF), another applicable material, and/or combinations thereof.

In some embodiments, the conductive features 162 and 164 are made of metallic material such as copper, aluminum, gold, palladium, cobalt, titanium, nickel, silver, graphene, one or more other suitable conductive materials, an alloy thereof, or a combination thereof.

In some embodiments, the substrate 160 also includes a solder resist layer 168 disposed over the insulating layer 1661 and partially covering the conductive features 164 in the insulating layer 1661. In some embodiments, the conductive features 164 in the insulating layer 1661 are conductive pad and used to hold or receive the bonding elements 150.

The substrate 160 also includes pre-formed trenches 170, in accordance with some embodiments. In some embodiments, the trenches 170 are located directly under the open corners 120C1 and 120C4 of the semiconductor dies 120. In some embodiments, the trenches 170 extend from the top surface of the substrate 160 into the interior of the substrate 160.

For example, the bottom surface of the trenches 170 may be located within one of the insulating layers $166_2$-$166_5$ such as within the insulating layer $166_3$—, as shown in FIG. 1F. In some embodiments, the trenches 170 have a depth D in a range from about 50 μm to about 250 μm. In some embodiments, the ratio of the depth D to the thickness T in a range from about 0.02 to about 0.25. The conductive features 164 are not exposed from the trenches 170, in accordance with some embodiments. In some embodiments, none of the bonding elements is disposed directly above the trenches 170.

In some embodiments, the bonding process includes forming under bump metallurgy structures 148 over the conductive features 108 exposed from the insulating layer $114_1$. In some embodiments, the under bump metallurgy structures 148 correspond and are in contact with the conductive features 108.

In some embodiments, the under bump metallurgy structures 148 are used to hold or receive the bonding elements 150. In some embodiments, the under bump metallurgy structures 148 are made of or include metallic material such as titanium, copper, nickel, tantalum, vanadium, chromium, gold, tungsten, an alloy thereof, a multi-layer thereof, or a combination thereof. In some embodiments, the under bump metallurgy structures 148 are made of non-solder metallic material. In some embodiments, the under bump metallurgy structures 148 are formed using sputtering, evaporation, plating, another suitable technique, and/or a combination thereof.

In some embodiments, an electroplating process is performed to form the bonding elements 150 over the under bump metallurgy structures 148. In alternative embodiments, the bonding elements 150 are pre-formed and placed over the conductive pads 162 of the substrate 160.

In some embodiments, the bonding elements 150 are solder joints, controlled collapse chip connection (C4) bumps, solder bumps, solder balls, ball grid array (BGA) balls, another suitable bonding elements, and/or a combination thereof. In some embodiments, the bonding elements 150 are tin-containing solder balls bumps or solder balls. The tin-containing solder bumps or balls may include copper, silver, gold, aluminum, lead, one or more other suitable materials, or a combination thereof. In some embodiments, the bonding elements 150 are lead-free.

The conductive feature 108 of the redistribution structure 106 of the package structure 146 are bonded to the conductive feature 164 (e.g., conductive pad) of the substrate 160 in the insulating layer $166_1$ through the under bump metallurgy structures 148 and the bonding elements 150, in accordance with some embodiments. In some embodiments, a thermal reflow operation is carried out. Lower portion of the bonding elements 150 are surrounded by the solder resist layer 160, in accordance with some embodiments. In some embodiments, the bonding elements 150 correspond to and connect the under bump metallurgy structures 148 and the conductive pad 162. As such, the integrated circuit 124 of the semiconductor die 120 is electrically coupled to the conductive features and/or the functional circuit of the substrate 160, in accordance with some embodiments.

FIG. 1F-1 is a plan view of the package structure shown in FIG. 1F in that FIG. 1F is taken along line I-I shown in FIG. 1F-1, in accordance with some embodiments of the disclosure. FIG. 1F-1 illustrates footprints (or projections) of the semiconductor dies 120 and the redistribution structure 106 projected onto the substrate 160. In some embodiments, the trenches 170 are located directly under and overlap the open corners 120C1 and 120C4 of the semiconductor die 120. In some embodiments, no trench 170 is located directly under the closed corners 120C2 and/or 120C3 of the semiconductor dies 120.

Figures 1, 1F, 2:
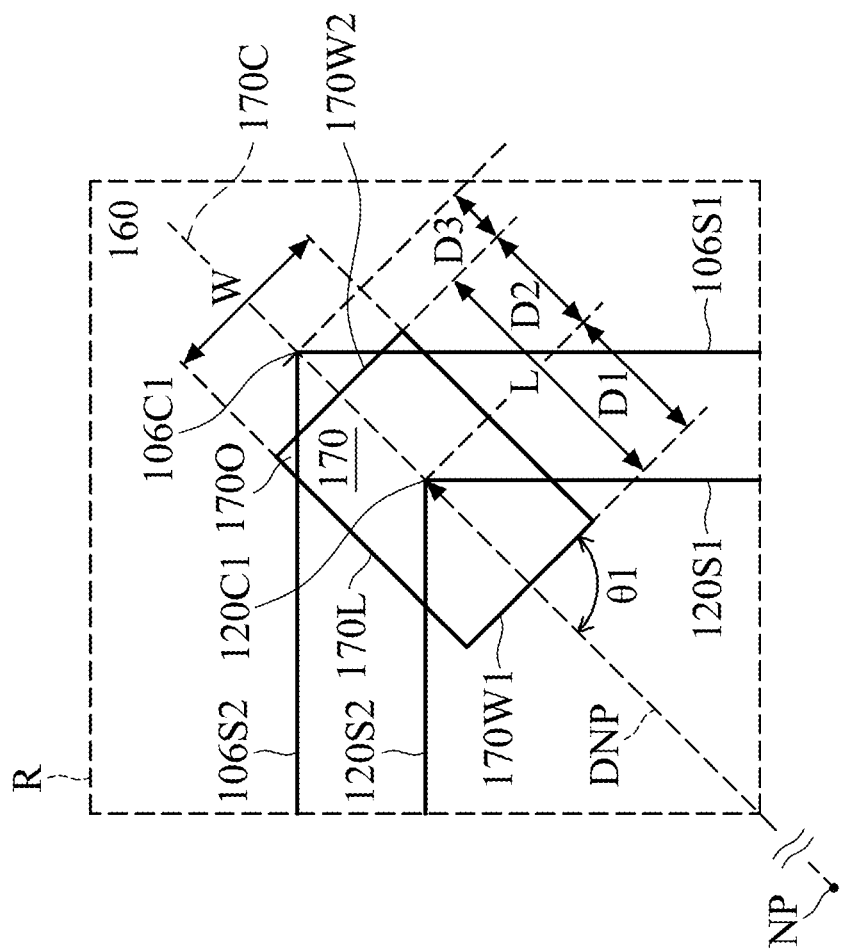

FIG. 1F-2 is an enlarged plan view of area R shown in FIG. 1F-1 to illustrate details of the trench 170 proximate to the open corner 120C1 of one semiconductor die 120, in accordance with some embodiments of the disclosure. For illustration simplicity, features of the package structure may be described below using the trench 170 proximate to the open corner 120C1 of one semiconductor die 120, but these features can be suitable for other areas of the package structure such as the trenches 170 proximate to the open corners 120C4 of the semiconductor die 120 and proximate to the open corners 120C1 and 120C4 of the other semiconductor die 120.

The corner 120C1 of the semiconductor die 120 overlaps the trench 170, in accordance with some embodiments. In FIG. 1F-2, the corner 120C1 of the semiconductor die 120 is confined within the area of the trench 170, in accordance with some embodiments. Most portion of the trench 170 is located within the area of the redistribution structure 106, in accordance with some embodiments. In illustrated embodiments, the trench 170 includes two portions 1700 outside of the area of the redistribution structure 106 at the sidewall 106S1 and sidewall 106S2 respectively.

A large difference of coefficients of thermal expansion (CTE) may exist between the substrate 160 and the semiconductor dies 120, and thus a tensile stress may be induced and applied to the underfill material 138 during reliability tests, operations of the package structure and/or thermal processes. The tensile stress may be concentrated, especially at the open corners 120C1 and 120C4 of the semiconductor dies 120. The concentration of the tensile stress may cause the formation of cracks within the underfill material 138. The cracks may propagate into the molding compound 140.

In accordance with the embodiments of the present disclosure, the substrate 160 includes trenches 170 which are directly under the open corners 120C1 and 120C4, and thus reducing or mitigating the tensile stress concentrated at the corner of the semiconductor die 120. As a result, the risk of cracking the underfill material 138 may be reduced, improving the performance and reliability of the package structure.

In some embodiments, the trench 170 has a rectangular-shaped profile, as shown in FIG. 1F-2. The shape of the trench 170 is not limited thereto, and the trench 170 may include a curved/arcuate sidewall. In some embodiments, the trench 170 extends in its longitudinal direction 170C. The longitudinal direction 170C is also the symmetry axis of the trench 170, in accordance with some embodiments.

The edge of the trench 170 includes first sidewalls 170L (e.g., the long side of the rectangular-shaped profile) parallel to the longitudinal direction 170C and second sidewalls 170W1 and 170W2 (e.g., the short side of the rectangular-shaped profile) perpendicular to the longitudinal direction 170C, in accordance with some embodiments. In some embodiments, the first sidewalls 170L and the second sidewalls 170W1 and 170W2 are linear surface. The second sidewall 170W1 is located within the area of the semiconductor die 120, and the second sidewall 170W2 is located outside of the area of the semiconductor die 120, in accordance with some embodiments.

In some embodiments, the trench 170 has a dimension L (i.e., the length of the trench 170) as measured in the longitudinal direction 170C. In some embodiments, the dimension L is in a range from about 1.0 mm to about 2.0 mm. In some embodiments, the trench 170 has a dimension W (i.e., the width of the trench 170) as measured in a direction perpendicular to the longitudinal direction 170C. In some embodiments, the dimension W is in a range from about 0.5 mm to about 1.0 mm. In some embodiments, the aspect ratio (W/D) of the trench 170 is in a range from about 2 to about 20.

For example, if the dimension L and/or dimension W is too large, it may reduce the density of routing of the resulting package structure. If the dimension L and/or dimension W is too small, the tensile stress concentrated at the corner of the semiconductor die 120 cannot be effectively mitigated, thereby increasing the risk of cracking the underfill material 138.

In some embodiments, the dimension L is greater than the dimension W. If the dimension L is less than the dimension W, the tensile stress concentrated at the corner of the semiconductor die 120 cannot be effectively mitigated, thereby increasing the risk of cracking the underfill material 138.

In some embodiments, the longitudinal direction 170C of the trench 170 is substantially parallel to a distance to a neutral point (DNP) direction. The DNP direction is defined as the direction from the geometric center NP of the redistribution structure 106 to the open corner (such as 120C1 and/or 120C4) of the semiconductor die 120.

In illustrated embodiments, the angle of the DNP direction and the longitudinal direction 170C is about 0 degrees. That is, in illustrated embodiments, the angle $\theta 1$ of the DNP direction and the second sidewall 170W1 is about 90 degrees. In alternative embodiments, the angle of the DNP direction and the longitudinal direction 170C is greater than 0 degree and less than about 15 degrees. For example, if the angle of the DNP direction and the longitudinal direction 170C too large, the tensile stress concentrated at the corner of the semiconductor die 120 cannot be effectively mitigated, thereby increasing the risk of cracking the underfill material 138.

In some embodiments, the DNP direction is aligned or collinear with the longitudinal direction 170C. In some embodiments, the longitudinal direction 170C passes through the corner 120C1.

In some embodiments, the second sidewall 170W1 (within the area of the semiconductor die 120) is distanced from the corner 120C1 by the minimum distance D1 as measured in the longitudinal direction 170C. In some embodiments, the distance D1 is in a range from about 0.5 mm to about 1.5 mm. In some embodiments, the distance D1 is from about 0.5 to about 0.75 of the dimension L.

In some embodiments, the second sidewall 170W2 (outside of the area of the semiconductor die 120) is distanced from the corner 120C1 by the minimum distance D2 as measured in the longitudinal direction 170C. In some embodiments, the distance D2 is in a range from about 0.25 mm to about 1 mm. In some embodiments, the sum of the distance D1 and the distance D2 is equal to the dimension L. In some embodiments, the distance D2 is in from about 0.25 to about 0.5 of the dimension L.

For example, if the distance D1 and/or distance D2 is too large, it may reduce the density of routing of the resulting package structure. If the distance D1 and/or distance D2 is too small, the tensile stress concentrated at the corner of the semiconductor die 120 cannot be effectively mitigated, thereby increasing the risk of cracking the underfill material 138.

In some embodiments, the distance D1 is greater than or equal to the distance D2. In some embodiments, the ratio of the distance D1 to the distance D2 is in a range from about 1 to about 3 such as from about 1.25 about 1.75. For example, if the ratio of the distance D1 to distance D2 is too large or too small, the tensile stress concentrated at the corner of the semiconductor die 120 cannot be effectively mitigated, thereby increasing the risk of cracking the underfill material 138.

In some embodiments, the second sidewall 170W2 is distanced from the corner 106C1 of the redistribution structure 106 by the minimum distance D3 as measured in the longitudinal direction 170C. In some embodiments, the distance D3 is less than 0.1 mm. In some embodiments, the distance D3 is less than the distance D2.

Figure 1G:
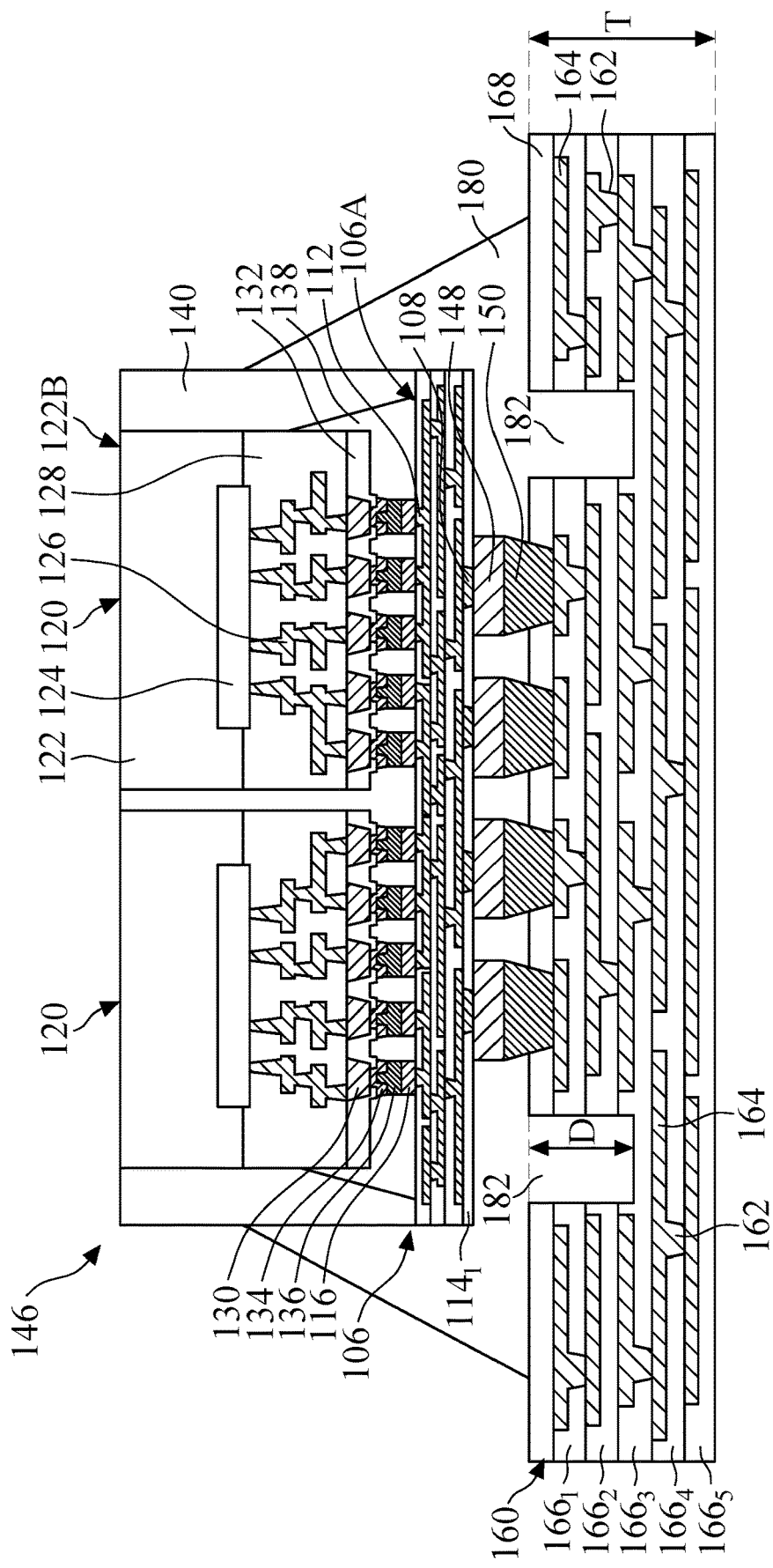
Figures 1, 1G:
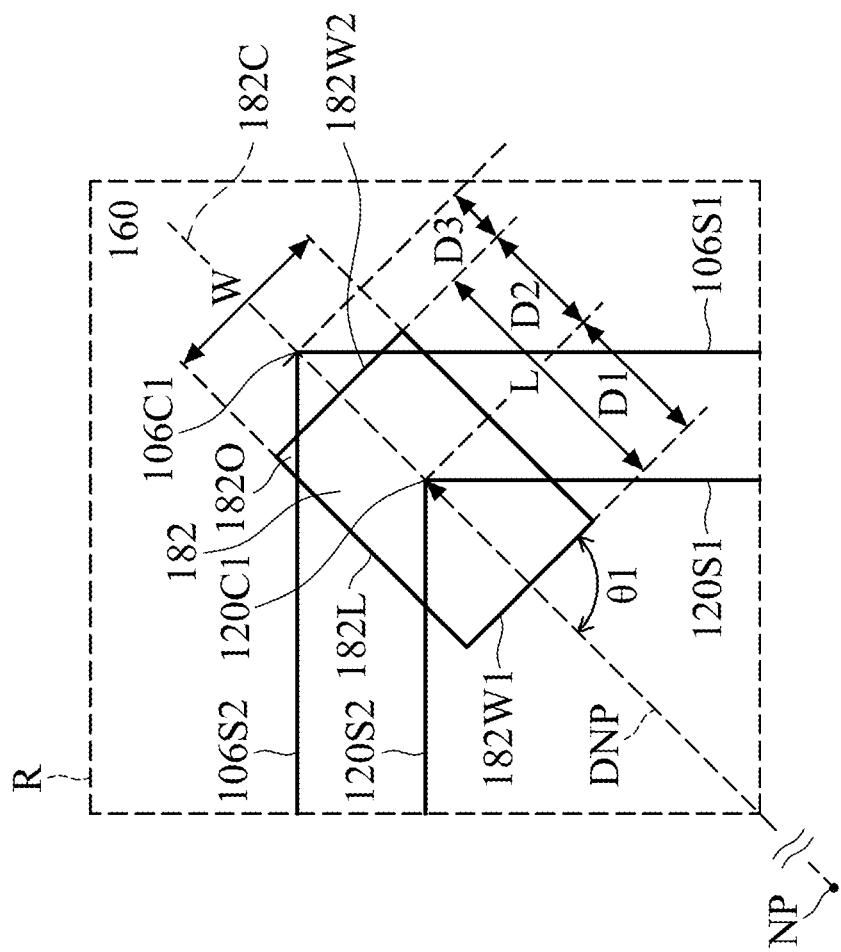
Figure 2:
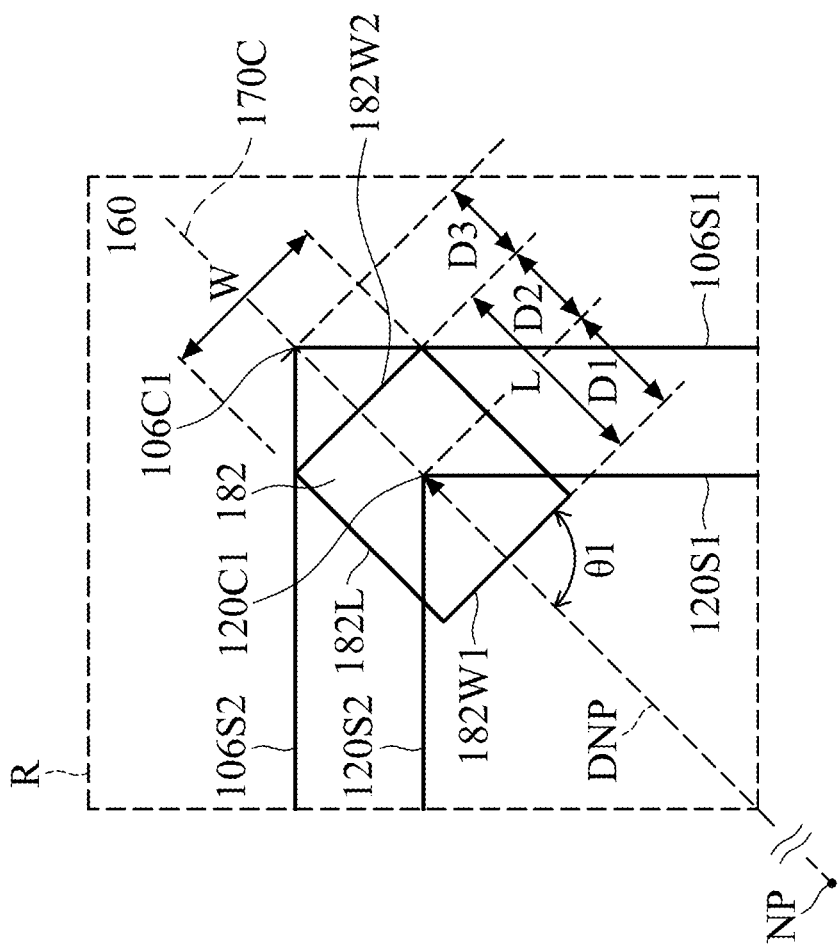

An underfill material 180 is formed over the upper surface of the substrate 160 and encapsulates and/or surround the package structure 146, the under bump metallurgy structures 148 and the bonding elements 150, as shown in FIG. 1G, in accordance with some embodiments. The underfill material 180 fills the spacing between the bonding elements 150, in accordance with some embodiments. The underfill material 180 fills the trenches 170, in accordance with some embodiments. The portions of the underfill material 180 embedded in the substrate 160 is referred as extension portions 182. In some embodiments, the extension portion 182 is isolated from the conductive features 162 and 164 by the insulating layers 166. The underfill material 180 covers the sidewalls of the molding compound 140 and the sidewalls of the redistribution structure 106, in accordance with some embodiments.

In some embodiments, the underfill material 180 is an electrically insulated adhesive for protecting the bonding elements 150 and/or securing the package structure 146. In some embodiments, the underfill material 180 is made of epoxy, resin, epoxy molding compounds, another suitable underfill material, and/or a combination thereof.

FIG. 1G-1 is an enlarged plan view of FIG. 1G corresponding to area R shown in FIG. 1F-1 to illustrate details of the extension portion 182, in accordance with some embodiments of the disclosure. FIG. 1G-1 illustrates footprints (or projections) of the semiconductor die 120, the redistribution structure 106 and the extension portion 182 projected onto the substrate 160. For illustration simplicity, features of the package structure may be described below using the extension portion 182 proximate to the open corner 120C1 of one semiconductor die 120, but these features can be suitable for other areas of the package structure such as the extension portions 182 proximate to the open corners 120C4 of the semiconductor die 120 and proximate to the open corners 120C1 and 120C4 of the other semiconductor die 120.

The extension portion 182 is located directly under and overlaps the corner 120C1 of the semiconductor die 120, in accordance with some embodiments. In FIG. 1G-1, the corner 120C1 of the semiconductor die 120 is confined within the area of the extension portion 182, in accordance with some embodiments. Most portion of the extension portion 182 is located within the area of the redistribution structure 106, in accordance with some embodiments. In illustrated embodiments, the extension portion 182 includes two portions 182O outside of the area of the redistribution structure 106 at the sidewall 106S1 and sidewall 106S2 respectively.

In some embodiments, the extension portion 182 filled in the trench 170 has substantially the same profile as the trench 170, for example, a rectangular-shaped profile, as shown in FIG. 1G-1. In some embodiments, the extension portion 182 extends in its longitudinal direction 182C. The longitudinal direction 182C is also the symmetry axis of the trench 182, in accordance with some embodiments.

The edge of the extension portion 182 includes first sidewalls 182L (e.g., long side of the rectangular-shaped profile) parallel to the longitudinal direction 182C and second sidewalls 182W1 and 182W2 (e.g., the short side of the rectangular-shaped profile) perpendicular to the longitudinal direction 182C, in accordance with some embodiments. In some embodiments, the first sidewalls 182L and the second sidewalls 182W1 and 182W2 are linear surface. The second sidewall 182W1 is located within the area of the semiconductor die 120, and the second sidewall 182W2 is located outside of the area of the semiconductor die 120, in accordance with some embodiments.

In some embodiments, the extension portion 182 has a dimension L (i.e., the length of the extension portion 182) as measured in the longitudinal direction 182C. In some embodiments, the dimension L is in a range from about 1.0 mm to about 2.0 mm. In some embodiments, the extension portion 182 has a dimension W (i.e., the width of the extension portion 182) as measured in a direction perpendicular to the longitudinal direction 182C. In some embodiments, the dimension W is in a range from about 0.5 mm to about 1.0 mm. In some embodiments, the dimension L is greater than the dimension W.

In some embodiments, the longitudinal direction 182C of the extension portion 182 is substantially parallel to the DNP direction. In some embodiments, the angle of the DNP direction and the longitudinal direction 182C is about 0 degrees. That is, in illustrated embodiments, the angle θ1 of the DNP direction and the second sidewall 182W1 is about 90 degrees. In alternative embodiments, the angle of the DNP direction and the longitudinal direction 182C is greater than 0 degree and less than about 15 degrees.

In some embodiments, the DNP direction is aligned or collinear with the longitudinal direction 182C. In some embodiments, the longitudinal direction 182C passes through the corner 120C1.

In some embodiments, the second sidewall 182W1 (within the area of the semiconductor die 120) is distanced from the corner 120C1 by the minimum distance D1 as measured in the longitudinal direction 182C. In some embodiments, the distance D1 is in a range from about 0.5 mm to about 1.5 mm. In some embodiments, the distance D1 is from about 0.5 to about 0.75 of the dimension L.

In some embodiments, the second sidewall 182W2 (outside of the area of the semiconductor die 120) is distanced from the corner 120C1 by the minimum distance D2 as measured in the longitudinal direction 182C. In some embodiments, the distance D2 is in a range from about 0.25 mm to about 1 mm. In some embodiments, the sum of the distance D1 and the distance D2 is equal to the dimension L. In some embodiments, the distance D2 is in from about 0.25 to about 0.5 of the dimension L.

In some embodiments, the distance D1 is greater than or equal to the distance D2. In some embodiments, the ratio of the distance D1 to the distance D2 is in a range from about 1 to about 3 such as from about 1.25 about 1.75.

In some embodiments, the second sidewall 182W2 is distanced from the corner 106C1 of the redistribution structure 106 by the minimum distance D3 as measured in the longitudinal direction 182C. In some embodiments, the distance D3 is less than 0.1 mm. In some embodiments, the distance D3 is less than the distance D2.

In accordance with the embodiments of the present disclosure, the extension portions 182 are located directly under the open corners 120C1 and 120C4 of the semiconductor dies 120 and embedded in the substrate 160. As a result, the risk of cracking the underfill material 138 may be reduced, improving the performance and reliability of the package structure.

FIG. 2 is a modification of FIG. 1G-1, in accordance with some embodiments of the disclosure. The package structure of FIG. 2 is similar to the package structure of FIG. 1G-1, except that the extension portion 182 has no portion outside of the redistribution structure 106.

The extension portion 182 is substantially entirely confined within the area of the redistribution structure 106, in accordance with some embodiments. As such, the extension portion 182 has no portion outside of the redistribution structure 106, in accordance with some embodiments.

Figure 3:
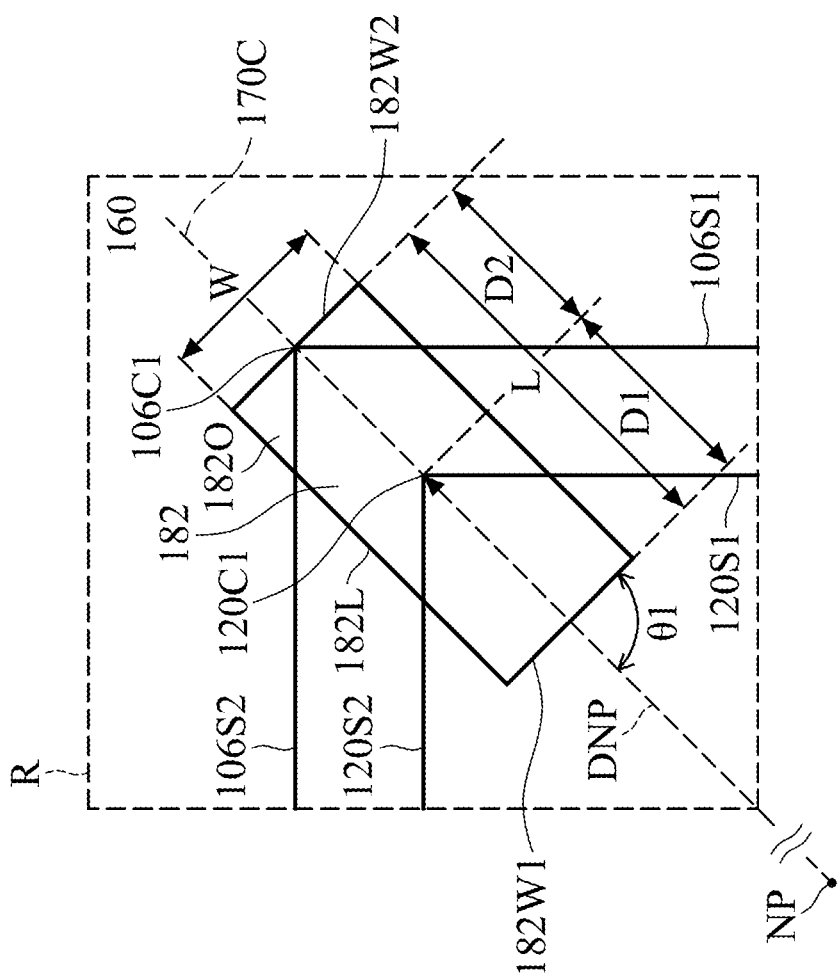
FIG. 3 is a modification of FIG. 1G-1, in accordance with some embodiments of the disclosure.

FIG. 3 is a modification of FIG. 1G-1, in accordance with some embodiments of the disclosure. The package structure of FIG. 3 is similar to the package structure of FIG. 1G-1, except that the second sidewall 182W2 of the extension portion 182 (outside of the semiconductor die 120) passes through the corner 106C1 of redistribution structure 106. As such, the minimum distance D3 between the second sidewall 182W2 and the corner 106C1 is zero.

Figure 4:
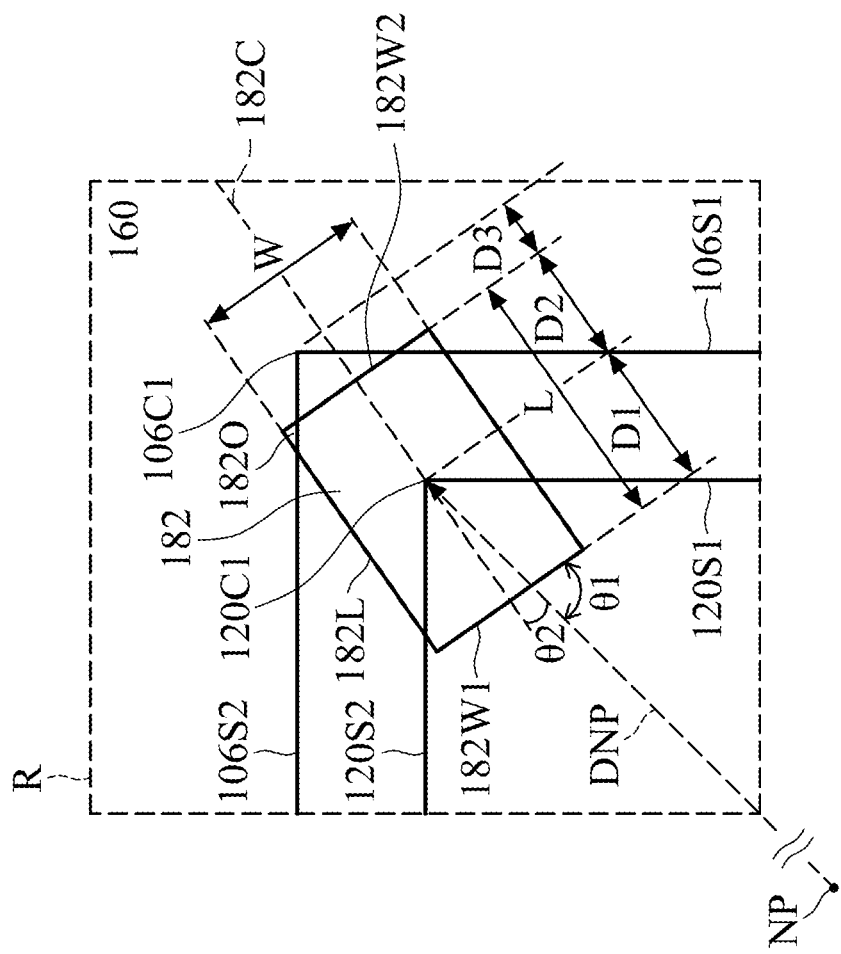
FIG. 4 is a modification of FIG. 1G-1, in accordance with some embodiments of the disclosure.

FIG. 4 is a modification of FIG. 1G-1, in accordance with some embodiments of the disclosure. The package structure of FIG. 4 is similar to the package structure of FIG. 1G-1, except that the longitudinal direction 182C of the extension portion 182 is not parallel to the DNP direction.

In illustrated embodiments, the angle θ2 of the DNP direction and the longitudinal direction 182C is greater than 0 degrees and less than about 15 degrees. That is, in illustrated embodiments, the angle θ1 of the DNP direction and the second sidewall 182W1 is greater than 75 degrees and less than 90 degrees.

Figure 5:
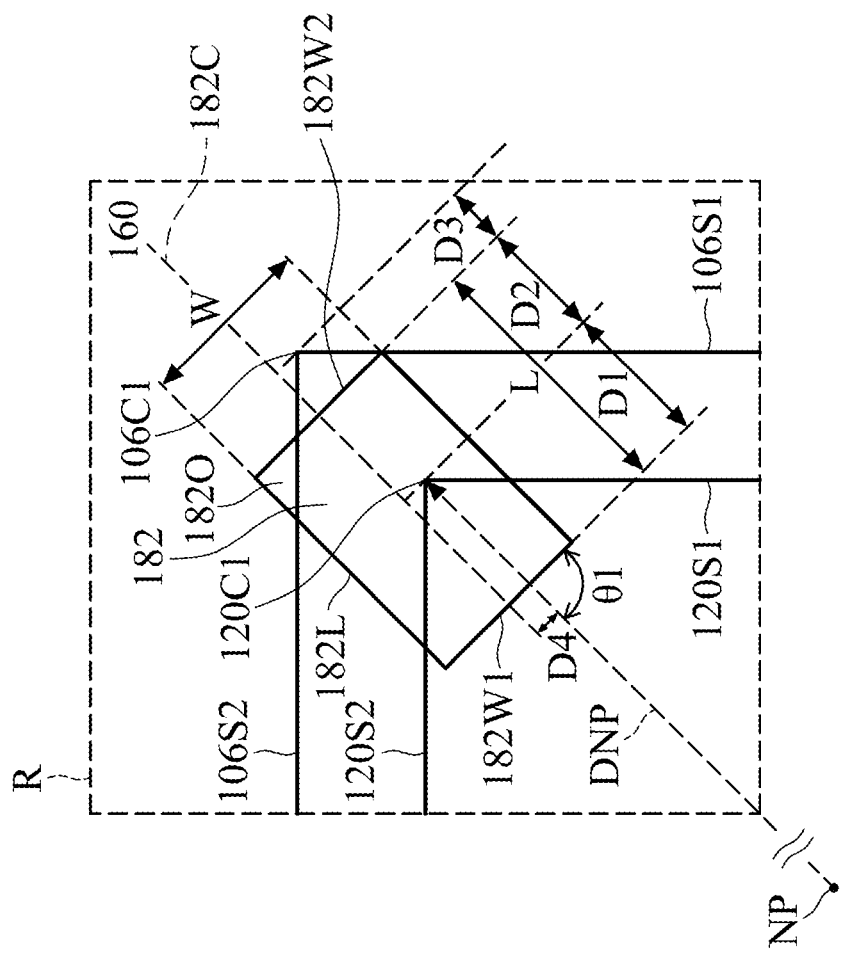
FIG. 5 is a modification of FIG. 1G-1, in accordance with some embodiments of the disclosure.

FIG. 5 is a modification of FIG. 1G-1, in accordance with some embodiments of the disclosure. The package structure of FIG. 5 is similar to the package structure of FIG. 1G-1, except that the DNP direction is not aligned or collinear with the longitudinal direction 182C.

In some embodiments, the longitudinal direction 182C is offset from the DNP direction by a distance D4. In some embodiments, the longitudinal direction 182C does not pass through the corner 120C1. In illustrated embodiments, the extension portion 182 includes a portion 182O outside of the area of the redistribution structure 106 only at the sidewall 106S2.

In some embodiments, the ratio of the distance D4 to the dimension W is less about than 0.2. For example, if the ratio of the distance D4 to dimension W is too large or too small, the tensile stress concentrated at the corner of the semiconductor die 120 cannot be effectively mitigated, thereby increasing the risk of cracking the underfill material 138.

Figures 1, 6:
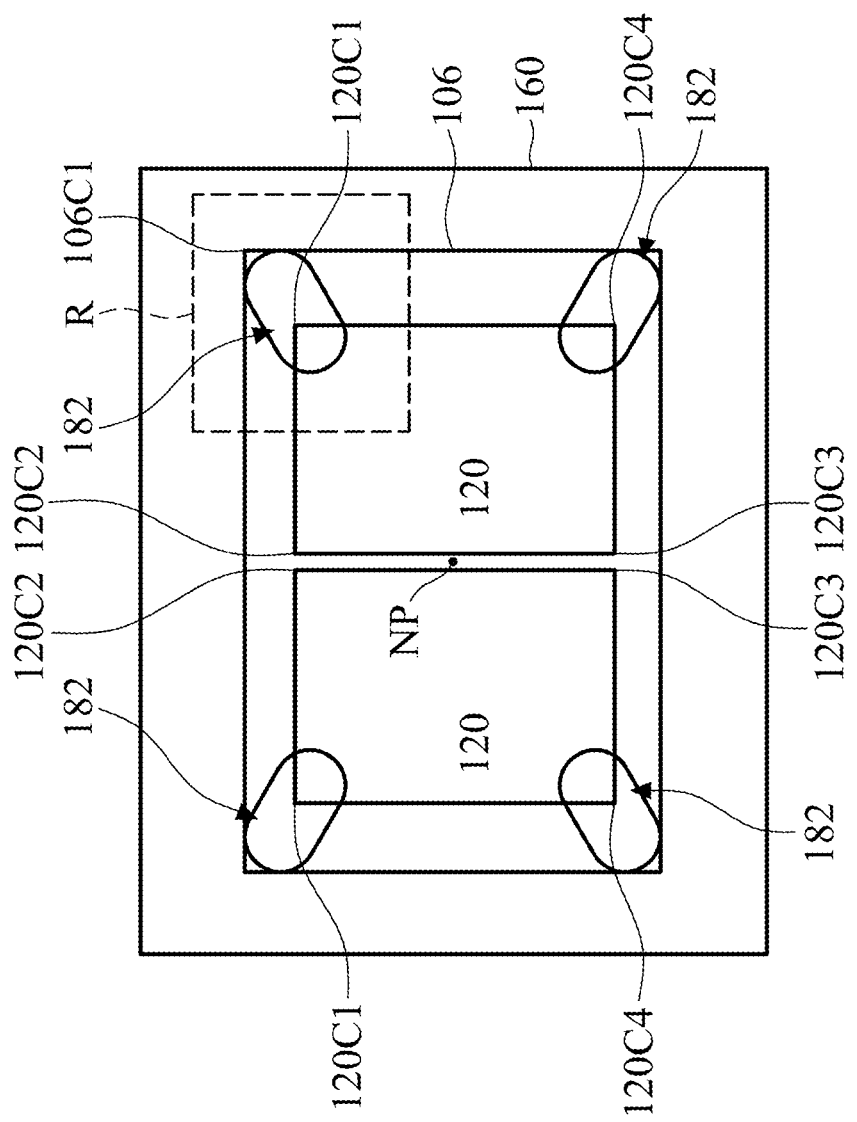
Figures 2, 6:
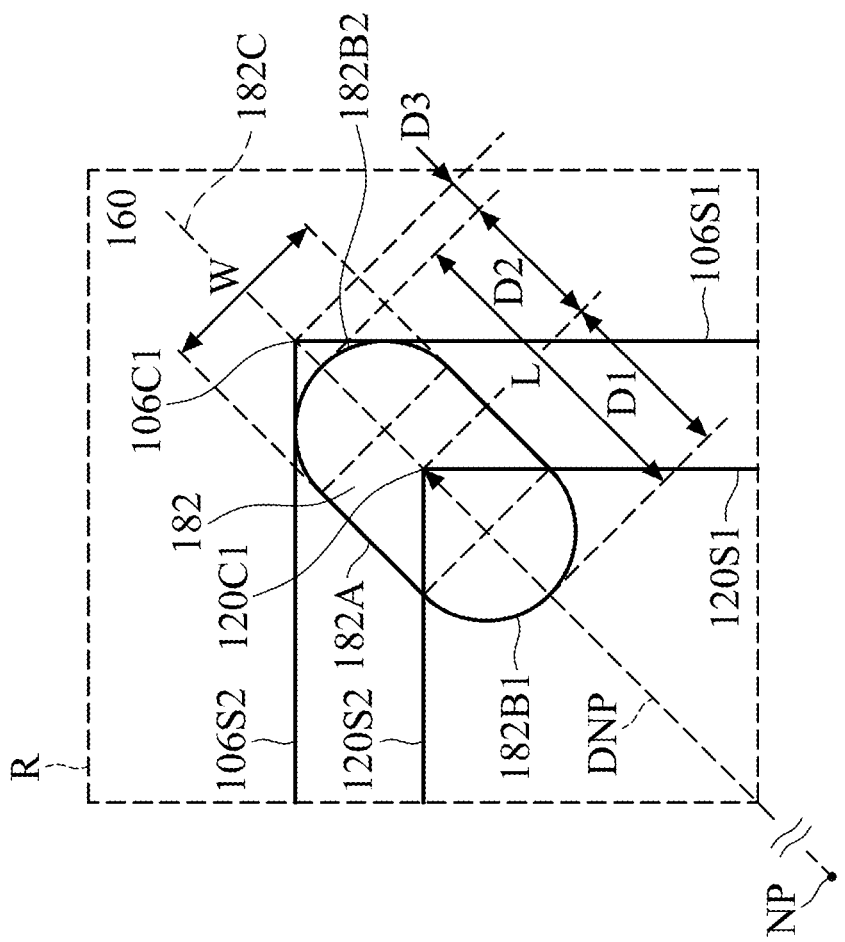

FIG. 6-1 is a plan view of a modification of the package structure of FIG. 1G, in accordance with some embodiments of the disclosure. The package structure of FIG. 6-1 is similar to the package structure of FIG. 1G-1, except that the extension portion 182 has a rounded rectangular-shaped profile.

FIG. 6-2 is an enlarged plan view of area R shown in FIG. 6-1, in accordance with some embodiments of the disclosure. For illustration simplicity, features of the package structure may be described below using the extension portion 182 proximate to the open corner 120C1 of one semiconductor die 120, but these features can be suitable for other areas of the package structure such as the extension portion 182 proximate to the open corners 120C4 of the semiconductor die 120 and proximate to the open corners 120C1 and 120C4 of the other semiconductor die 120.

The edge of the extension portion 182 includes first sidewalls 182A and second sidewalls 182B1 and 182B2, in accordance with some embodiments. In some embodiments, the first sidewalls 182A are parallel to the longitudinal direction 182C and are linear surfaces. In some embodiments, the second sidewalls 182B1 and 182B2 are arcuate surfaces. For example, the first sidewalls 182A may be tangent to the second sidewalls 182B1 and/or 182B2 at the connection of the first sidewalls 182A and the second sidewalls 182B1 and/or 182B2.

In some embodiments, the second sidewall 182B1 is located within the area of the semiconductor die 120, and the second sidewall 182B2 is located outside of the area of the semiconductor die 120, in accordance with some embodiments. The extension portion 182 is substantially entirely confined within the area of the redistribution structure 106, in accordance with some embodiments.

In some embodiments, the extension portion 182 has a maximum dimension L as measured in the longitudinal direction 182C. In some embodiments, the dimension L is in a range from about 1.0 mm to about 2.0 mm. In some embodiments, the extension portion 182 has a maximum dimension W as measured in a direction perpendicular to the longitudinal direction 182C. In some embodiments, the dimension W is in a range from about 0.5 mm to about 1.0 mm. In some embodiments, the dimension L is greater than the dimension W. In some embodiments, the radius of curvature of the second sidewall 182B1 and/or 182B2 is substantially equal to half of the dimension W.

In some embodiments, the second sidewall 182B1 (within the area of the semiconductor die 120) is distanced from the corner 120C1 by a maximum distance D1 as measured in the longitudinal direction 182C. In some embodiments, the distance D1 is in a range from about 0.5 mm to about 1.5 mm. In some embodiments, the distance D1 is from about 0.5 to about 0.75 of the dimension L.

In some embodiments, the second sidewall 182B2 (outside of the area of the semiconductor die 120) is distanced from the corner 120C1 by a maximum distance D2 as measured in the longitudinal direction 182C. In some embodiments, the distance D2 is in a range from about 0.25 mm to about 1 mm. In some embodiments, the sum of the distance D1 and the distance D2 is equal to the dimension L. In some embodiments, the distance D2 is in from about 0.25 to about 0.5 of the dimension L.

In some embodiments, the distance D1 is greater than or equal to the distance D2. In some embodiments, the ratio of the distance D1 to the distance D2 is in a range from about 1 to about 3 such as from about 1.25 about 1.75.

In some embodiments, the second sidewall 182B2 is distanced from the corner 106C1 of the redistribution structure 106 by the minimum distance D3 as measured in the longitudinal direction 182C. In some embodiments, the distance D3 is less than 0.1 mm. In some embodiments, the distance D3 is less than the distance D2.

Figures 1, 7:
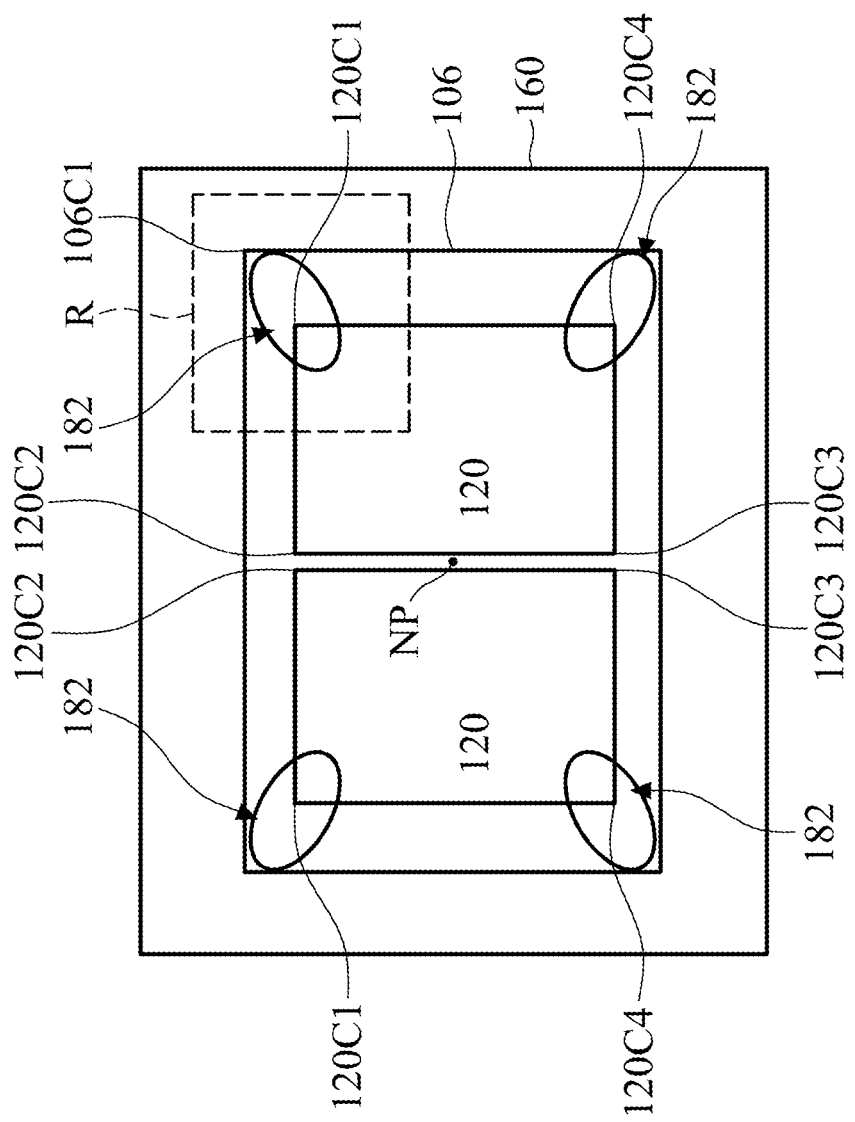
Figures 2, 7:
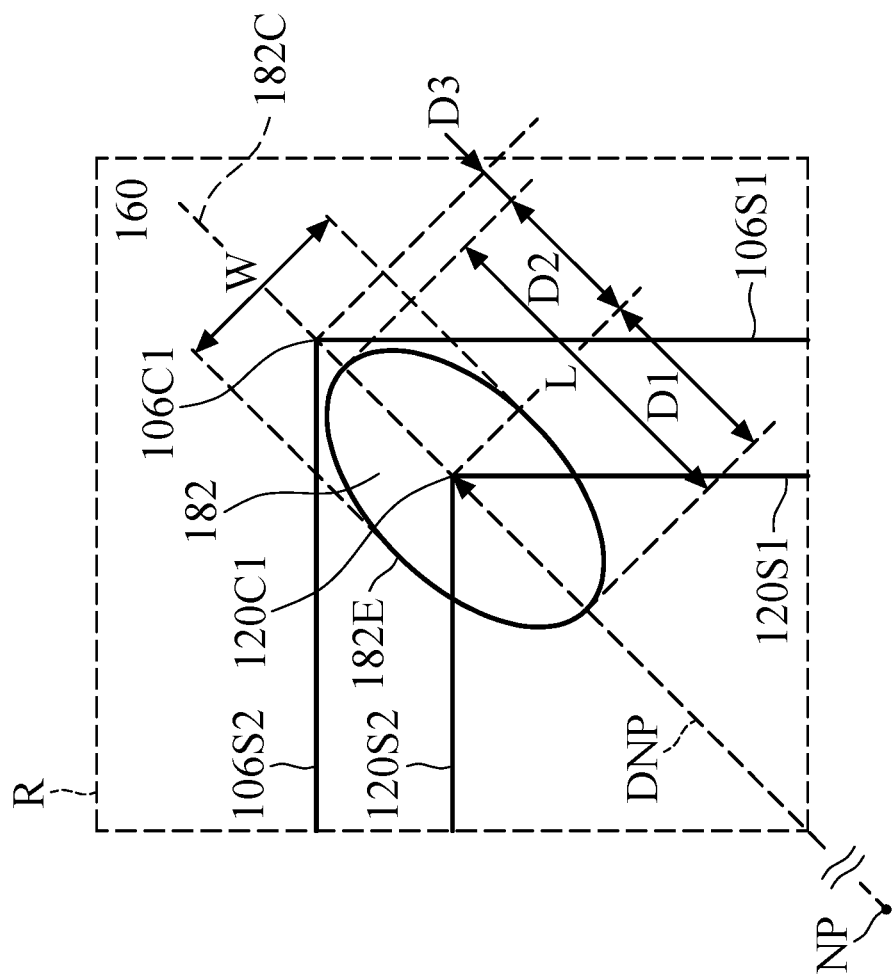

FIG. 7-1 is a plan view of a modification of the package structure of FIG. 1G, in accordance with some embodiments of the disclosure. The package structure of FIG. 7-1 is similar to the package structure of FIG. 1G-1, except that the edge 182E of the extension portion 182 has an elliptic-shaped profile.

FIG. 7-2 is an enlarged plan view of area R shown in FIG. 7-1, in accordance with some embodiments of the disclosure. For illustration simplicity, features of the package structure may be described below using the extension portion 182 proximate to the open corner 120C1 of one semiconductor die 120, but these features can be suitable for other areas of the package structure such as the extension portion 182 proximate to the open corners 120C4 of the semiconductor die 120 and proximate to the open corners 120C1 and 120C4 of the other semiconductor die 120.

The extension portion 182 is substantially entirely confined within the area of the redistribution structure 106, in accordance with some embodiments. In some embodiments, the extension portion 182 has a dimension L (i.e., major axis of the elliptic-shaped profile) as measured in the longitudinal direction 182C. In some embodiments, the dimension L is in a range from about 1.0 mm to about 2.0 mm. In some embodiments, the extension portion 182 has a dimension W (i.e., minor axis of the elliptic-shaped profile) as measured in the direction perpendicular to the longitudinal direction 182C. In some embodiments, the dimension W is in a range from about 0.5 mm to about 1.0 mm. In some embodiments, the dimension L is greater than the dimension W.

In some embodiments, the portion of the edge 182E within the area of the semiconductor die 120 is distanced from the corner 120C1 by a maximum distance D1 as measured in the longitudinal direction 182C. In some embodiments, the distance D1 is in a range from about 0.5 mm to about 1.5 mm. In some embodiments, the distance D1 is from about 0.5 to about 0.75 of the dimension L.

In some embodiments, the portion of the edge 182E outside of the area of the semiconductor die 120 is distanced from the corner 120C1 by a maximum distance D2 as measured in the longitudinal direction 182C. In some embodiments, the distance D2 is in a range from about 0.25 mm to about 1 mm. In some embodiments, the sum of the distance D1 and the distance D2 is equal to the dimension L. In some embodiments, the distance D2 is in from about 0.25 to about 0.5 of the dimension L.

In some embodiments, the distance D1 is greater than or equal to the distance D2. In some embodiments, the ratio of the distance D1 to the distance D2 is in a range from about 1 to about 3 such as from about 1.25 about 1.75.

In some embodiments, the portion of the edge 182E outside of the area of the semiconductor die 120 is distanced from the corner 106C1 of the redistribution structure 106 by the minimum distance D3 as measured in the longitudinal direction 182C. In some embodiments, the distance D3 is less than 0.1 mm. In some embodiments, the distance D3 is less than the distance D2.

Figure 8:
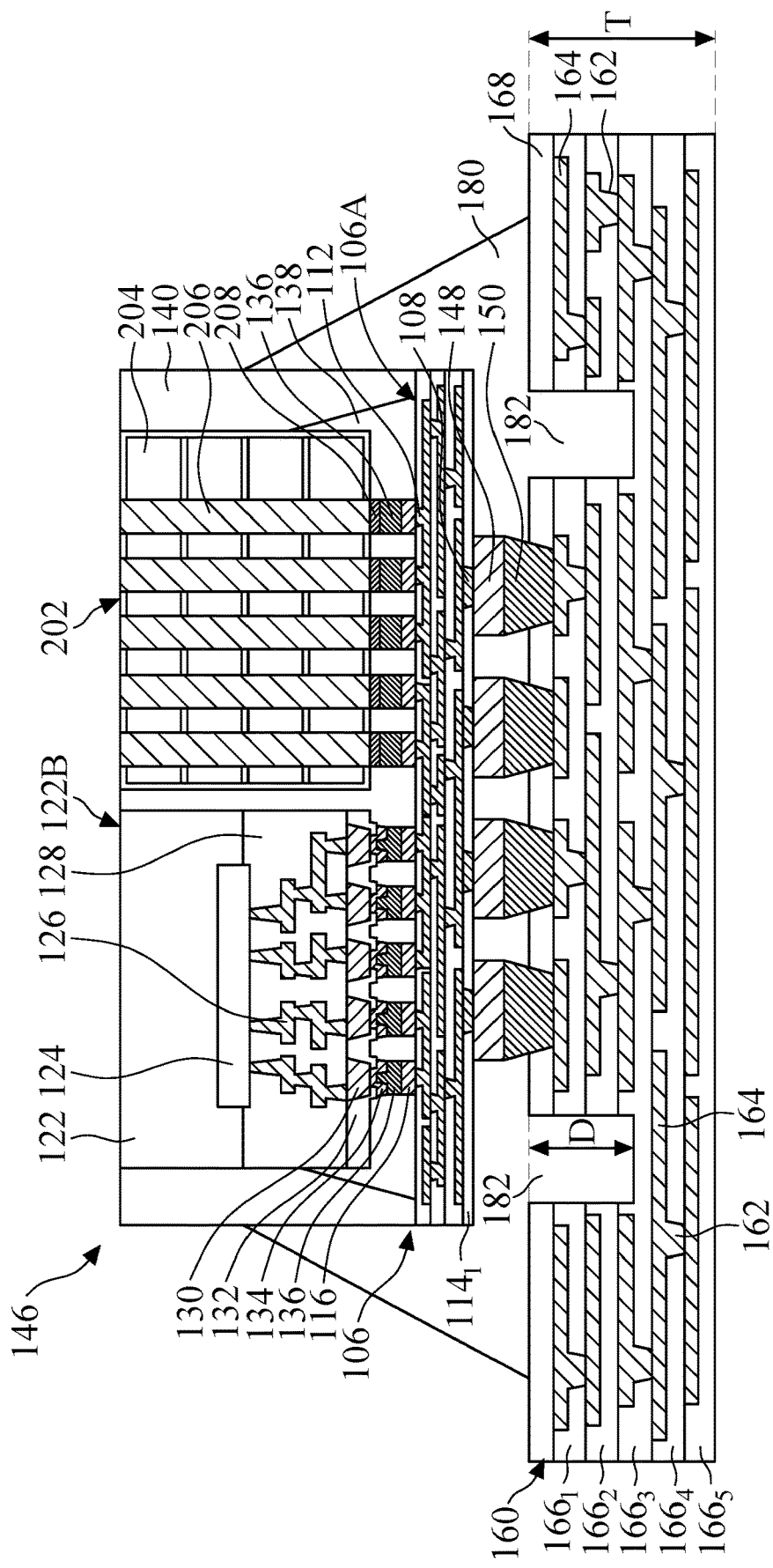
FIG. 8 is a modification of the cross-sectional view illustrated in FIG. 1G, in accordance with some embodiments of the disclosure.
Figures 1, 8:
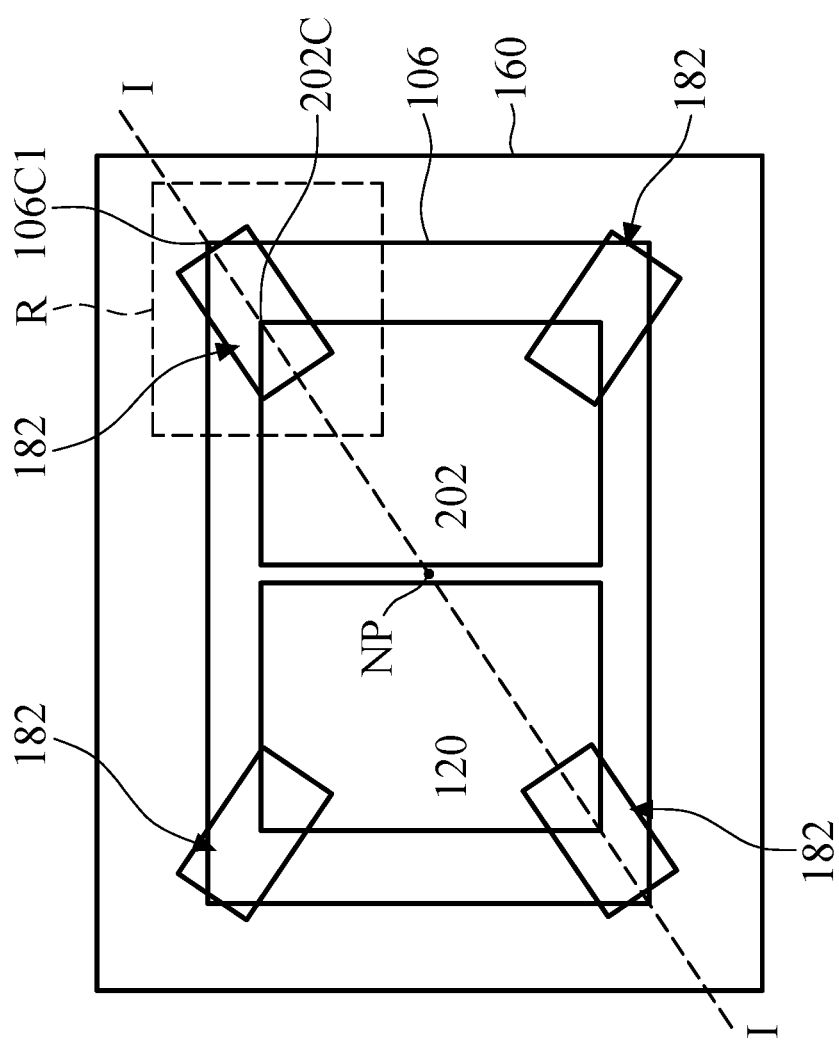
Figures 2, 8:
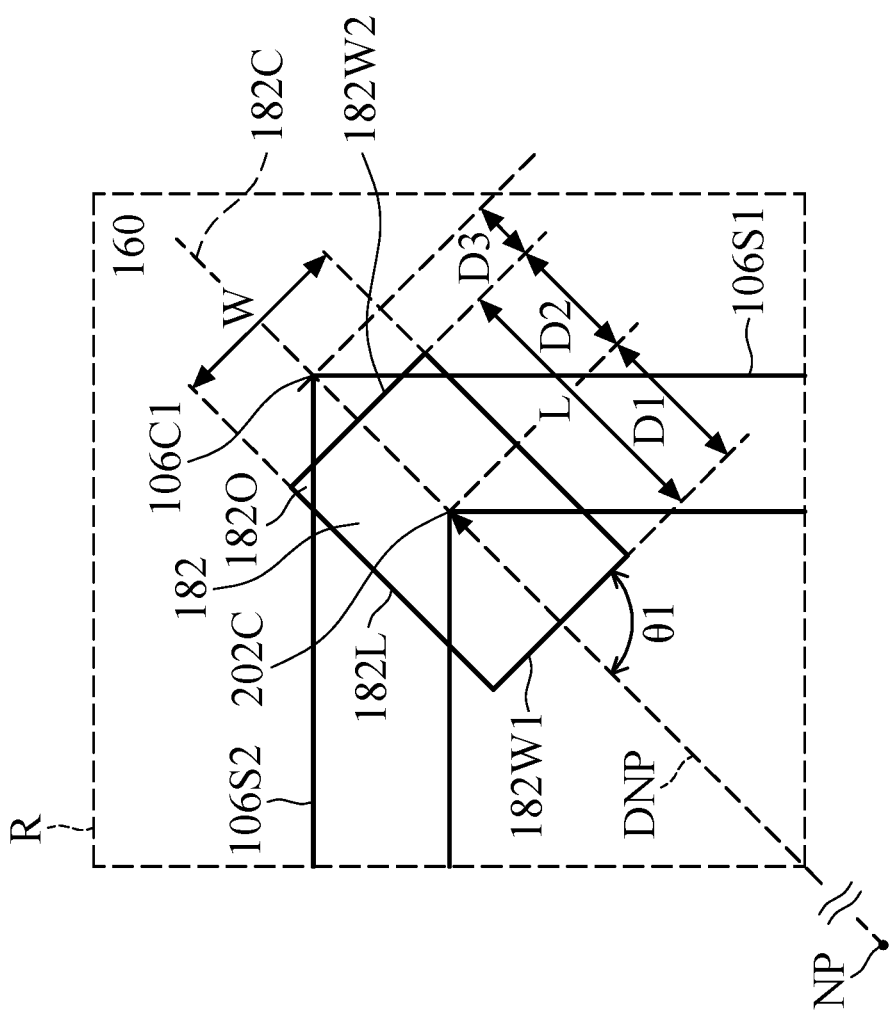

FIG. 8 is a modification of the cross-sectional view illustrated in FIG. 1G, in accordance with some embodiments of the disclosure. The package structure of FIG. 8 is similar to the package structure of FIG. 1G, except for the package structure of FIG. 8 including a package 202, in accordance with some embodiments.

A package 202 are disposed over the top surface 106A of the redistribution structure 106, as shown in FIG. 8, in accordance with some embodiments. In some embodiments, the package 202 includes high bandwidth memory (HBM) device. For example, the package 202 includes multiple stacked memory chips 204 and conductive through holes 206 electrically coupled to the memory chips 202. The package 202 also includes conductive pads 208 which are in contact with the conductive through holes 206 and bonded to conductive vias 112 of the redistribution structure 106 through the bonding elements 136 and the under bump metallurgy structures 116, in accordance with some embodiments. As such, the package 202 is electrically coupled to the substrate 160, in accordance with some embodiments.

The components of the package 202 shown in FIG. 8 are merely for the purpose of illustration. In alternative embodiments, the package 202 is a chip-scale package (CSP), chip on wafer on substrate (CoWoS) package, a system on integrated chip (SoIC) package, and/or a three dimensional integrated circuit (3DIC).

The substrate 160 includes pre-formed trenches 170, in accordance with some embodiments. In some embodiments, the trenches 170 are located directly under the open corners of the package 202. The underfill material 180 includes extension portions 182 filling the trenches 170, in accordance with some embodiments.

FIG. 8-1 is a plan view of the package structure shown in FIG. 8 in that FIG. 8 is taken along line I-I shown in FIG. 8-1, in accordance with some embodiments of the disclosure. FIG. 8-1 illustrates footprints (or projections) of the semiconductor die 120, the package 202, the redistribution structure 106 and the extension portion 182 projected onto the substrate 160. The extension portions 182 overlap the open corners 202C of the package 202, as shown in FIG. 8-1, in accordance with some embodiments.

FIG. 8-2 is an enlarged plan view of area R shown in FIG. 8-1 to illustrate details of the extension portion 182 proximate to an open corner 202C of the package 202, in accordance with some embodiments of the disclosure. The configuration of the extension portion 182 shown in FIG. 8-2 is substantially the same as that shown in FIG. 1G-1, and the description thereof will not be repeated. In addition, the modification as described above with respect to FIGS. 2, 3, 4, 5, 6-2 and/or 7-2 can be made to the extension portion 182 shown in FIG. 8-2.

In accordance with the embodiments of the present disclosure, the extension portions 182 are located directly under the open corners 202C of the package 202 and embedded in the substrate 160 and thus reducing or mitigating the tensile stress concentrated at the corner of the package 202. As a result, the risk of cracking the underfill material 138 may be reduced, improving the performance and reliability of the package structure.

Figure 9:
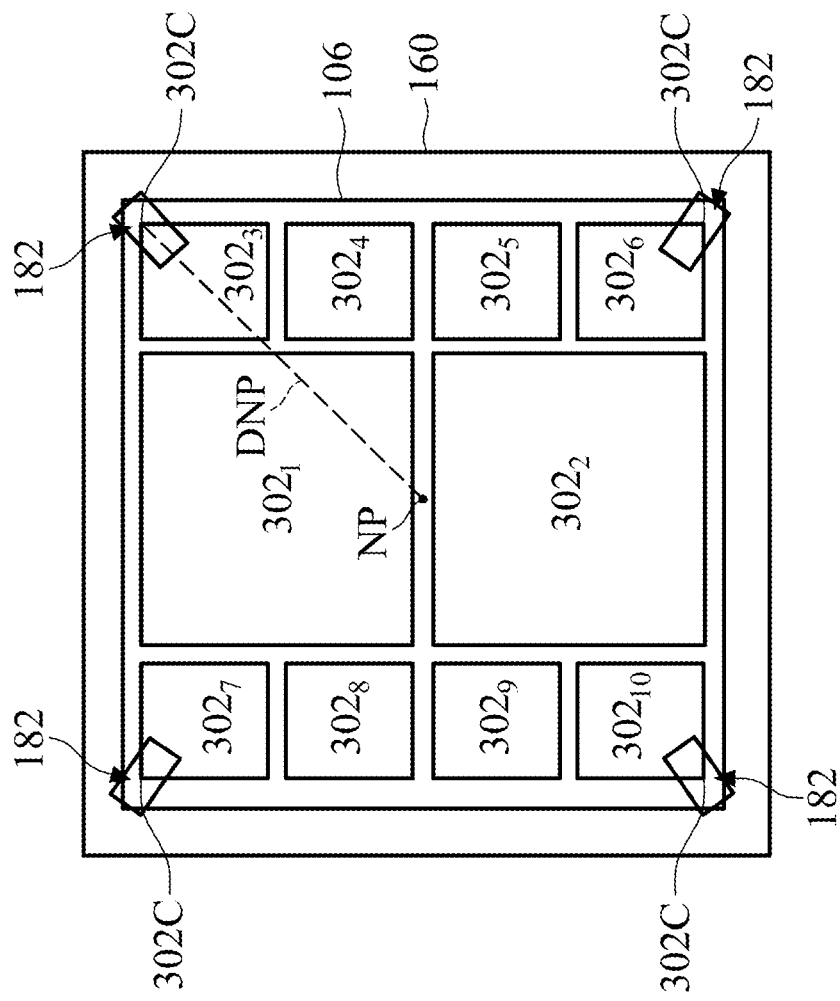
FIG. 9 is a plan view of a modification of the package structure of FIG. 8-1, in accordance with some embodiments of the disclosure.

FIG. 9 is a plan view of a modification of the package structure of FIG. 8-1, in accordance with some embodiments of the disclosure. The package structure of FIG. 9 is similar to the package structure of FIG. 8-1, except that the package structure includes a plurality of package components 302.

The package components 302 (including $302_{1-10}$) may be the semiconductor die 120 or the package 202 described above, in accordance with some embodiments. For example, the package components $302_{1-2}$ may be semiconductor die including SoC devices and the package components $302_{3-10}$ may be package including HBM device.

Each of the package components 302 include conductive pad (not shown) which are bonded to conductive vias 112 of the redistribution structure 106 through the bonding elements 136 and the under bump metallurgy structures 116, in accordance with some embodiments. As such, the package components 302 are electrically coupled to the substrate 160, in accordance with some embodiments.

In some embodiments, each of the package components $302_{3, 6, 7 \text{ and } 10}$ has an open corner 302C which are not disposed adjacent to any package components. The substrate 160 includes pre-formed trenches 170, in accordance with some embodiments. In some embodiments, the trenches 170 are located directly under the open corners 302C of the package components $302_{3, 6, 7 \text{ and } 10}$. The underfill material 180 includes extension portions 182 that fill the trenches 170, in accordance with some embodiments.

In some embodiments, no trench 170 is located directly under the closed corners of the package components $302_{1-10}$, which are disposed immediately adjacent to other package components.

The extension portions 182 overlap the open corners 202C of the package components $302_{3, 6, 7 \text{ and } 10}$, as shown in FIG. 9, in accordance with some embodiments. The configuration of the extension portions 182 shown in FIG. 9 is substantially the same as that shown in FIG. 1G-1, and the description thereof will not be repeated. In addition, the modification as described above with respect to FIGS. 2, 3, 4, 5, 6-2 and/or 7-2 can be made to the extension portions 182 shown in FIG. 9.

As described above, the embodiments of the present disclosure provide a package structure. The package structure includes the substrate 160 which includes trenches 170 directly under the open corners 120C1 and 120C4 and filled with underfill material 180. As a result, the tensile stress concentrated at the corner of the semiconductor die 120 may be reduced or mitigated. Therefore, the risk of cracking the underfill material 138 may be reduced, improving the performance and reliability of the package structure.

Embodiments of a package structure may be provided. The package structure may include a redistribution structure over a substrate and a semiconductor die over the redistribution structure and electrically coupled to the substrate. The package structure may also include an underfill material over the substrate and including an extension portion. The extension portion overlaps a corner of the semiconductor die and extends into the substrate. As a result, the tensile stress concentrated at the corner of the semiconductor die may be reduced or mitigated. Therefore, the risk of cracking of an underfill material may be reduced, improving the performance and reliability of the package structure.

In some embodiments, a package structure is provided. The package structure includes a redistribution structure over a substrate, a semiconductor die over the redistribution structure and electrically coupled to the substrate, and an underfill material over the substrate and encapsulating the redistribution structure and the semiconductor die. The underfill material includes an extension portion overlapping a corner of the semiconductor die and extending into the substrate.

In some embodiments, a package structure is provided. The package structure includes a plurality of bonding elements over a substrate, a redistribution structure over the bonding elements, a semiconductor die over the redistribution structure, and an underfill material including a first portion surrounding the plurality of bonding elements and a second portion embedded in the substrate. In a plan view, a corner of the semiconductor die is confined within an area of the second portion.

In some embodiments, a method for forming a package structure is provided. The method includes bonding a semiconductor die to a first surface of a redistribution structure, bonding a second surface of the redistribution structure to a substrate, wherein the substrate includes a first trench overlapping a corner of the semiconductor die, encapsulating the semiconductor die and the redistribution structure with an underfill material. The first trench of the substrate is filled with underfill material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a redistribution structure over a substrate;
   a semiconductor die over the redistribution structure and electrically coupled to the substrate; and
   an underfill material over the substrate and encapsulating the redistribution structure and the semiconductor die, wherein the underfill material includes an extension portion overlapping a corner of the semiconductor die and extending into the substrate, the substrate includes a first insulating layer and a first conductive trace embedded in the first insulating layer, a bottom surface of the extension portion is lower than a bottom surface of the first conductive trace, and in a plan view, a direction from a geometric center of the redistribution structure to the corner of the semiconductor die is defined as a first direction, and an angle of the first direction and a longitudinal direction of the extension portion is less than about 15 degrees.

2. The package structure as claimed in claim 1, wherein in a plan view, the extension portion includes a portion outside of an area of the redistribution structure.

3. The package structure as claimed in claim 1, wherein the extension portion is isolated from the first conductive trace by the first insulating layer.

4. The package structure as claimed in claim 1, wherein:
   in a plan view, the extension portion includes a first sidewall located within an area of the semiconductor die and a second sidewall opposite to the first sidewall and located outside of the area of the semiconductor die, and
   a minimum distance between the first sidewall of the extension portion and the corner of the semiconductor die is greater than or equal to a minimum distance between the second sidewall of the extension portion and the corner of the semiconductor die.

5. The package structure as claimed in claim 1, wherein a sidewall of the extension portion includes an arcuate surface.

6. The package structure as claimed in claim 1, further comprising:
   a plurality of bonding elements interposing between the substrate and the redistribution structure and surrounded by the underfill material, wherein none of the bonding elements is located directly over the extension portion.

7. A package structure, comprising:
   a plurality of bonding elements over a substrate;
   a redistribution structure over the bonding elements;
   a semiconductor die over the redistribution structure; and
   an underfill material comprising:
   a first portion surrounding the plurality of bonding elements; and
   a second portion embedded in the substrate, wherein in a plan view, a corner of the semiconductor die is confined within an area of the second portion, wherein in a plan view, a first direction from a geometric center of the redistribution structure extending to the corner of the semiconductor die is substantially parallel to a symmetry axis of the second portion.

8. The package structure as claimed in claim 7, wherein in a plan view, the second portion is entirely confined within an area of the redistribution structure.

9. The package structure as claimed in claim 7, wherein in a plan view, the second portion has an elliptical profile.

10. The package structure as claimed in claim 7, wherein a bottom surface of the second portion is higher than a bottom surface of the substrate.

11. The package structure as claimed in claim 7, wherein in a plan view, a length of the second portion along the first direction is greater than a width of the second portion along a second direction that is perpendicular to the first direction.

12. The package structure as claimed in claim 7, wherein:
in a plan view, the second portion includes a first sidewall located within an area of the semiconductor die and a second sidewall opposite to the first sidewall and located outside of the area of the semiconductor die, and as measured in the first direction, a first distance between the first sidewall and the corner of the semiconductor die is greater than or equal to a second distance between the second sidewall and the corner of the semiconductor die.

13. The package structure as claimed in claim 12, wherein as measured in the first direction, a third distance between a corner of the redistribution structure and the second sidewall is less than the second distance.

14. The package structure as claimed in claim 7, further comprising:
a package over the redistribution structure, wherein the underfill material comprises:
a third portion embedded in the substrate, wherein in a plan view, a corner of the package is confined within an area of the third portion.

15. A method for forming a package structure, comprising:
bonding a semiconductor die to a first surface of a redistribution structure;
bonding a package to the first surface of the redistribution structure;
bonding a second surface of the redistribution structure to a substrate, wherein the substrate includes a first trench overlapping a corner of the semiconductor die and a second trench overlapping a corner of the package; and
encapsulating the semiconductor die and the redistribution structure with an underfill material, wherein the first trench and the second trench of the substrate are filled with underfill material.

16. The method for forming the package structure as claimed in claim 15, wherein the redistribution structure is bonded to the substrate through a plurality of bonding elements, and the underfill material surrounds the plurality of bonding elements.

17. The method for forming the package structure as claimed in claim 15, wherein in a plan view, a symmetry axis of the first trench passes through the corner of the semiconductor die.

18. The package structure as claimed in claim 1, wherein the substrate further includes a second insulating layer below the first insulating layer and a second conductive trace embedded in the second insulating layer, and the bottom surface of the extension portion is higher than an upper surface of the second conductive trace.

19. The method for forming the package structure as claimed in claim 15, wherein the substrate further includes an insulating layer and a conductive trace embedded in the insulating layer, and a bottom surface of the first trench is lower than a bottom surface of the conductive trace.

20. The package structure as claimed in claim 1, wherein:
in a plan view, the semiconductor die has a first sidewall and a second sidewall connected to the first sidewall at the corner, and the extension portion has a third sidewall, a fourth sidewall connected to the third sidewall, a fifth sidewall connected to the fourth sidewall, and a sixth sidewall connected to the fifth sidewall and the third sidewall,
the third sidewall of the extension portion crosses the first sidewall of the semiconductor die, and
the fifth sidewall of the extension portion crosses the second sidewall of the semiconductor die.

* * * * *